US008458556B2

(12) United States Patent
Planjery et al.

(10) Patent No.: US 8,458,556 B2
(45) Date of Patent: Jun. 4, 2013

(54) LOW COMPLEXITY FINITE PRECISION DECODERS AND APPARATUS FOR LDPC CODES

(75) Inventors: Shiva K. Planjery, Tucson, AZ (US); Shashi Kiran Chilappagari, San Jose, CA (US); Bane Vasic, Tucson, AZ (US); David Declercq, Ableiges (FR)

(73) Assignee: STMicroelectronics, SA, Montrouge (FR)

( * ) Notice: Subject to any disclaimer, the term of this patent is extended or adjusted under 35 U.S.C. 154(b) by 226 days.

(21) Appl. No.: 12/900,584

(22) Filed: Oct. 8, 2010

(65) Prior Publication Data

US 2011/0087946 A1  Apr. 14, 2011

Related U.S. Application Data

(60) Provisional application No. 61/278,757, filed on Oct. 9, 2009.

(51) Int. Cl.
*H03M 13/00* (2006.01)
(52) U.S. Cl.
USPC ............................ 714/752; 714/755; 714/758
(58) Field of Classification Search
USPC .......................................... 714/752, 755, 758
See application file for complete search history.

(56) References Cited

U.S. PATENT DOCUMENTS

| 2005/0257116 | A1* | 11/2005 | Zarrinkhat et al. | ........... | 714/755 |
| 2006/0274772 | A1* | 12/2006 | Kim et al. | ....................... | 370/412 |
| 2007/0201632 | A1* | 8/2007 | Ionescu | ........................ | 379/88.01 |
| 2010/0017676 | A1* | 1/2010 | Gross et al. | .................... | 714/752 |

OTHER PUBLICATIONS

Mackay et al., Weaknesses of Margulis and Ramanujan-Margulis Low-Density Parity-Check Codes, Electronic Notes in Theoretical Computer Science 74, 2003, 8 pgs., Elsevier Science B. V.
Tom Richardson, Error Floors of LDPC Codes, Flarion Technologies, pp. 1426-1435, Bedminster, NJ.
Declercq et al., Optimization of LDPC Finite Precision Belief Propagation Decoding with Discrete Density Evolution, ETIS ENSEA/ UPC/CNRS UMR-8051, Cergy-Pontoise, France.
Chen et al., Reduced-Complexity Decoding of LDPC Codes, IEEE Transactions of Communications, Aug. 2005, pp. 1288-1299, vol. 53, No. 8.
Jason Kwok-San Lee, Memory-Efficient Decoding of LDPC Codes, IEEE Xplore, University of California, Berkeley.

(Continued)

*Primary Examiner* — Sam Rizk
(74) *Attorney, Agent, or Firm* — Hogan Lovells US LLP

(57) ABSTRACT

In this invention, a new class of finite precision multilevel decoders for low-density parity-check (LDPC) codes is presented. These decoders are much lower in complexity compared to the standard belief propagation (BP) decoder. Messages utilized by these decoders are quantized to certain levels based on the number of bits allowed for representation in hardware. A message update function specifically defined as part of the invention, is used to determine the outgoing message at the variable node, and the simple min operation along with modulo 2 sum of signs is used at the check node. A general methodology is provided to obtain the multilevel decoders, which is based on reducing failures due to trapping sets and improving the guaranteed error-correction capability of a code. Hence these decoders improve the iterative decoding process on finite length graphs and have the potential to outperform the standard floating-point BP decoder in the error floor region. The description and apparatus of 3-bit decoders for column-weight three LDPC codes is also presented.

22 Claims, 23 Drawing Sheets

OTHER PUBLICATIONS

Chilappagari et al., Error Floors of LDPC Codes on the Binary Symmetric Channel, University of Arizona.

Chilappagari et al., LDPC Codes Which Can Correct Three Errors Under Iterative Decoding, IEEE, 2006, pp. 406-410, University of Arizona.

Richardson et al., Design of Capacity-Approaching Irregular Low-Density Parity-Check Codes, IEEE Transactions On Information Theory, Feb. 2001, pp. 619-637, vol. 47, No. 2.

Richardson et al., The Capacity of Low-Density Parity-Check Codes Under Message-Passing Decoding, IEEE Transactions On Information Theory, Feb. 2001, pp. 599-618, vol. 47, No. 2.

MacKay et al., Weaknesses of Margolis and Ramanujan-Margolis Low-Density Parity-Check Codes, Electronic Notes In Theoretical Computer Science 74, 2003, 8 pgs., Elsevier Science B.V.

Chen et al., Reduced-Complexity Decoding of LDPC Codes, IEEE Transactions of Communications, Aug. 2005, pp. 1288-1290, vol. 53, No. 8.

Smith et al., Low-Density Parity-Check Codes for Discretized Min-Sum Decoding, IEEE Xplore, 23rd Biennial Symposium of Communications, 2006, pp. 14-17, University of Toronto.

Chilappagari et al., LOPC Codes Which Can Correct Three Errors Under Iterative Decoding, IEEE, 2006, pp. 406-410, University of Arizona.

* cited by examiner

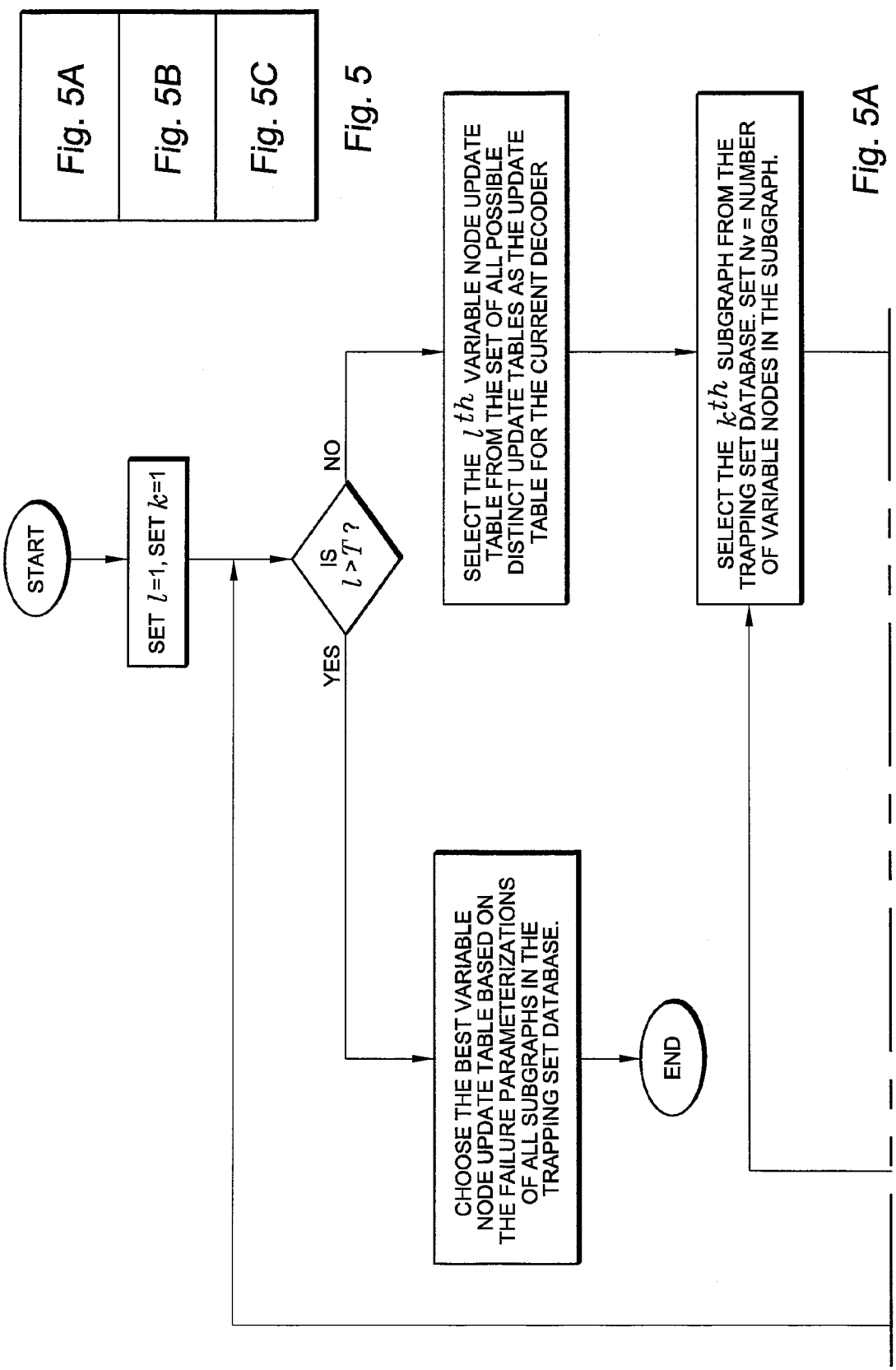

| $m_1$ | $m_2$ | CHANNEL VALUE $y_i$ | OUTGOING MESSAGE |
|---|---|---|---|
| $L_1$ | $L_1$ | $C$ | $L_2$ |
| $L_1$ | $L_1$ | $-C$ | 0 |
| $L_1$ | $L_2$ | $C$ | $L_2$ |
| $L_1$ | $L_2$ | $-C$ | $L_1$ |
| $L_1$ | $L_3$ | $C$ | $L_3$ |
| $L_1$ | $L_3$ | $-C$ | $L_2$ |
| $L_1$ | 0 | $C$ | $L_1$ |
| $L_1$ | 0 | $-C$ | 0 |
| $L_1$ | $-L_1$ | $C$ | $L_1$ |
| $L_1$ | $-L_1$ | $-C$ | $-L_1$ |
| $L_1$ | $-L_2$ | $C$ | $-L_1$ |
| $L_1$ | $-L_2$ | $-C$ | $-L_2$ |
| $L_1$ | $-L_3$ | $C$ | $-L_2$ |
| $L_1$ | $-L_3$ | $-C$ | $-L_3$ |
| $L_2$ | $L_2$ | $C$ | $L_3$ |
| $L_2$ | $L_2$ | $-C$ | $L_2$ |
| $L_2$ | $L_3$ | $C$ | $L_3$ |
| $L_2$ | $L_3$ | $-C$ | $L_3$ |
| $L_2$ | 0 | $C$ | $L_2$ |
| $L_2$ | 0 | $-C$ | $L_1$ |
| $L_2$ | $-L_1$ | $C$ | $L_2$ |
| $L_2$ | $-L_1$ | $-C$ | $L_1$ |
| $L_2$ | $-L_2$ | $C$ | $L_1$ |
| $L_2$ | $-L_2$ | $-C$ | $-L_1$ |
| $L_2$ | $-L_3$ | $C$ | $-L_2$ |
| $L_2$ | $-L_3$ | $-C$ | $-L_2$ |
| $L_3$ | $L_3$ | $C$ | $L_3$ |
| $L_3$ | $L_3$ | $-C$ | $L_3$ |

| $m_1$ | $m_2$ | CHANNEL VALUE $y_i$ | OUTGOING MESSAGE |
|---|---|---|---|
| $L_3$ | 0 | $C$ | $L_3$ |
| $L_3$ | 0 | $-C$ | $L_2$ |
| $L_3$ | $-L_1$ | $C$ | $L_3$ |
| $L_3$ | $-L_1$ | $-C$ | $L_2$ |
| $L_3$ | $-L_2$ | $C$ | $L_2$ |
| $L_3$ | $-L_2$ | $-C$ | $L_2$ |
| $L_3$ | $-L_3$ | $C$ | $L_1$ |
| $L_3$ | $-L_3$ | $-C$ | $-L_1$ |
| 0 | 0 | $C$ | $L_1$ |
| 0 | 0 | $-C$ | $-L_1$ |
| 0 | $-L_1$ | $C$ | 0 |
| 0 | $-L_1$ | $-C$ | $-L_1$ |
| 0 | $-L_2$ | $C$ | $-L_1$ |
| 0 | $-L_2$ | $-C$ | $-L_2$ |
| 0 | $-L_3$ | $C$ | $-L_2$ |
| 0 | $-L_3$ | $-C$ | $-L_3$ |
| $-L_1$ | $-L_1$ | $C$ | 0 |
| $-L_1$ | $-L_1$ | $-C$ | $-L_2$ |
| $-L_1$ | $-L_2$ | $C$ | $-L_1$ |
| $-L_1$ | $-L_2$ | $-C$ | $-L_2$ |
| $-L_1$ | $-L_3$ | $C$ | $-L_2$ |
| $-L_1$ | $-L_3$ | $-C$ | $-L_3$ |
| $-L_2$ | $-L_2$ | $C$ | $-L_2$ |
| $-L_2$ | $-L_2$ | $-C$ | $-L_3$ |
| $-L_2$ | $-L_3$ | $C$ | $-L_3$ |
| $-L_2$ | $-L_3$ | $-C$ | $-L_3$ |
| $-L_3$ | $-L_3$ | $C$ | $-L_3$ |
| $-L_3$ | $-L_3$ | $-C$ | $-L_3$ |

Fig. 6

| $m_1$ | $m_2$ | CHANNEL VALUE $y_i$ | OUTGOING MESSAGE | $m_1$ | $m_2$ | CHANNEL VALUE $y_i$ | OUTGOING MESSAGE |
|---|---|---|---|---|---|---|---|
| $L_1$ | $L_1$ | $C$ | $L_2$ | $L_3$ | $0$ | $C$ | $L_3$ |
| $L_1$ | $L_1$ | $-C$ | $0$ | $L_3$ | $0$ | $-C$ | $L_3$ |
| $L_1$ | $L_2$ | $C$ | $L_3$ | $L_3$ | $-L_1$ | $C$ | $L_3$ |
| $L_1$ | $L_2$ | $-C$ | $L_1$ | $L_3$ | $-L_1$ | $-C$ | $L_2$ |
| $L_1$ | $L_3$ | $C$ | $L_3$ | $L_3$ | $-L_2$ | $C$ | $L_3$ |
| $L_1$ | $L_3$ | $-C$ | $L_3$ | $L_3$ | $-L_2$ | $-C$ | $L_2$ |
| $L_1$ | $0$ | $C$ | $L_2$ | $L_3$ | $-L_3$ | $C$ | $L_1$ |
| $L_1$ | $0$ | $-C$ | $0$ | $L_3$ | $-L_3$ | $-C$ | $L_1$ |
| $L_1$ | $-L_1$ | $C$ | $L_1$ | $0$ | $0$ | $C$ | $L_1$ |
| $L_1$ | $-L_1$ | $-C$ | $-L_1$ | $0$ | $0$ | $-C$ | $-L_1$ |
| $L_1$ | $-L_2$ | $C$ | $0$ | $0$ | $-L_1$ | $C$ | $0$ |
| $L_1$ | $-L_2$ | $-C$ | $-L_2$ | $0$ | $-L_1$ | $-C$ | $-L_2$ |
| $L_1$ | $-L_3$ | $C$ | $-L_2$ | $0$ | $-L_2$ | $C$ | $0$ |
| $L_1$ | $-L_3$ | $-C$ | $-L_3$ | $0$ | $-L_2$ | $-C$ | $-L_2$ |
| $L_2$ | $L_2$ | $C$ | $L_3$ | $0$ | $-L_3$ | $C$ | $-L_3$ |
| $L_2$ | $L_2$ | $-C$ | $L_2$ | $0$ | $-L_3$ | $-C$ | $-L_3$ |
| $L_2$ | $L_3$ | $C$ | $L_3$ | $-L_1$ | $-L_1$ | $C$ | $0$ |
| $L_2$ | $L_3$ | $-C$ | $L_3$ | $-L_1$ | $-L_1$ | $-C$ | $-L_2$ |
| $L_2$ | $0$ | $C$ | $L_2$ | $-L_1$ | $-L_2$ | $C$ | $-L_1$ |
| $L_2$ | $0$ | $-C$ | $0$ | $-L_1$ | $-L_2$ | $-C$ | $-L_3$ |
| $L_2$ | $-L_1$ | $C$ | $L_2$ | $-L_1$ | $-L_3$ | $C$ | $-L_3$ |
| $L_2$ | $-L_1$ | $-C$ | $0$ | $-L_1$ | $-L_3$ | $-C$ | $-L_3$ |
| $L_2$ | $-L_2$ | $C$ | $L_1$ | $-L_2$ | $-L_2$ | $C$ | $-L_2$ |
| $L_2$ | $-L_2$ | $-C$ | $-L_1$ | $-L_2$ | $-L_2$ | $-C$ | $-L_3$ |
| $L_2$ | $-L_3$ | $C$ | $-L_2$ | $-L_2$ | $-L_3$ | $C$ | $-L_3$ |
| $L_2$ | $-L_3$ | $-C$ | $-L_3$ | $-L_2$ | $-L_3$ | $-C$ | $-L_3$ |
| $L_3$ | $L_3$ | $C$ | $L_3$ | $-L_3$ | $-L_3$ | $C$ | $-L_3$ |
| $L_3$ | $L_3$ | $-C$ | $L_3$ | $-L_3$ | $-L_3$ | $-C$ | $-L_3$ |

*Fig. 7*

| $m_1$ | $m_2$ | CHANNEL VALUE $y_i$ | OUTGOING MESSAGE |
|---|---|---|---|
| $L_1$ | $L_1$ | $C$ | $L_2$ |
| $L_1$ | $L_1$ | $-C$ | $L_1$ |
| $L_1$ | $L_2$ | $C$ | $L_2$ |
| $L_1$ | $L_2$ | $-C$ | $L_2$ |
| $L_1$ | 0 | $C$ | $L_1$ |
| $L_1$ | 0 | $-C$ | 0 |
| $L_1$ | $-L_1$ | $C$ | $L_1$ |
| $L_1$ | $-L_1$ | $-C$ | $-L_1$ |
| $L_1$ | $-L_2$ | $C$ | $-L_1$ |
| $L_1$ | $-L_2$ | $-C$ | $-L_2$ |
| $L_2$ | $L_2$ | $C$ | $L_2$ |
| $L_2$ | $L_2$ | $-C$ | $L_2$ |
| $L_2$ | 0 | $C$ | $L_2$ |
| $L_2$ | 0 | $-C$ | $L_1$ |
| $L_2$ | $-L_1$ | $C$ | $L_2$ |
| $L_2$ | $-L_1$ | $-C$ | $L_1$ |
| $L_2$ | $-L_2$ | $C$ | 0 |
| $L_2$ | $-L_2$ | $-C$ | 0 |
| 0 | 0 | $C$ | $L_1$ |
| 0 | 0 | $-C$ | $-L_1$ |
| 0 | $-L_1$ | $C$ | 0 |
| 0 | $-L_1$ | $-C$ | $-L_1$ |
| 0 | $-L_2$ | $C$ | $-L_1$ |
| 0 | $-L_2$ | $-C$ | $-L_2$ |
| $L_1$ | $-L_1$ | $C$ | $-L_1$ |
| $L_1$ | $-L_1$ | $-C$ | $-L_2$ |
| $L_1$ | $-L_2$ | $C$ | $-L_2$ |
| $L_1$ | $-L_2$ | $-C$ | $-L_2$ |
| $L_2$ | $-L_2$ | $C$ | $-L_2$ |
| $L_2$ | $-L_2$ | $-C$ | $-L_2$ |

Fig. 8

| $m_1$ | $m_2$ | CHANNEL VALUE $y_i$ | OUTGOING MESSAGE |
|---|---|---|---|
| $L_1$ | $L_1$ | $C$ | $L_2$ |
| $L_1$ | $L_1$ | $-C$ | $0$ |
| $L_1$ | $L_2$ | $C$ | $L_3$ |
| $L_1$ | $L_2$ | $-C$ | $L_1$ |
| $L_1$ | $L_3$ | $C$ | $L_3$ |
| $L_1$ | $L_3$ | $-C$ | $L_2$ |
| $L_1$ | $0$ | $C$ | $L_2$ |
| $L_1$ | $0$ | $-C$ | $-L_1$ |
| $L_1$ | $-L_1$ | $C$ | $L_1$ |
| $L_1$ | $-L_1$ | $-C$ | $-L_1$ |
| $L_1$ | $-L_2$ | $C$ | $0$ |
| $L_1$ | $-L_2$ | $-C$ | $-L_2$ |
| $L_1$ | $-L_3$ | $C$ | $-L_1$ |
| $L_1$ | $-L_3$ | $-C$ | $-L_3$ |
| $L_2$ | $L_2$ | $C$ | $L_3$ |
| $L_2$ | $L_2$ | $-C$ | $L_1$ |
| $L_2$ | $L_3$ | $C$ | $L_3$ |
| $L_2$ | $L_3$ | $-C$ | $L_2$ |
| $L_2$ | $0$ | $C$ | $L_3$ |
| $L_2$ | $0$ | $-C$ | $L_1$ |
| $L_2$ | $-L_1$ | $C$ | $L_2$ |
| $L_2$ | $-L_1$ | $-C$ | $0$ |
| $L_2$ | $-L_2$ | $C$ | $L_1$ |
| $L_2$ | $-L_2$ | $-C$ | $-L_1$ |
| $L_2$ | $-L_3$ | $C$ | $-L_1$ |
| $L_2$ | $-L_3$ | $-C$ | $-L_3$ |
| $L_3$ | $L_3$ | $C$ | $L_3$ |
| $L_3$ | $L_3$ | $-C$ | $L_3$ |
| $L_3$ | $0$ | $C$ | $L_3$ |
| $L_3$ | $0$ | $-C$ | $L_2$ |
| $L_3$ | $-L_1$ | $C$ | $L_3$ |
| $L_3$ | $-L_1$ | $-C$ | $L_1$ |
| $L_3$ | $-L_2$ | $C$ | $L_3$ |
| $L_3$ | $-L_2$ | $-C$ | $L_1$ |
| $L_3$ | $-L_3$ | $C$ | $L_1$ |
| $L_3$ | $-L_3$ | $-C$ | $-L_1$ |
| $0$ | $0$ | $C$ | $L_1$ |
| $0$ | $0$ | $-C$ | $-L_1$ |
| $0$ | $-L_1$ | $C$ | $L_1$ |
| $0$ | $-L_1$ | $-C$ | $-L_2$ |
| $0$ | $-L_2$ | $C$ | $-L_1$ |
| $0$ | $-L_2$ | $-C$ | $-L_3$ |
| $0$ | $-L_3$ | $C$ | $-L_2$ |
| $0$ | $-L_3$ | $-C$ | $-L_3$ |
| $-L_1$ | $-L_1$ | $C$ | $0$ |
| $-L_1$ | $-L_1$ | $-C$ | $-L_2$ |
| $-L_1$ | $-L_2$ | $C$ | $-L_1$ |
| $-L_1$ | $-L_2$ | $-C$ | $-L_3$ |
| $-L_1$ | $-L_3$ | $C$ | $-L_2$ |
| $-L_1$ | $-L_3$ | $-C$ | $-L_3$ |
| $-L_2$ | $-L_2$ | $C$ | $-L_1$ |
| $-L_2$ | $-L_2$ | $-C$ | $-L_3$ |
| $-L_2$ | $-L_3$ | $C$ | $-L_2$ |
| $-L_2$ | $-L_3$ | $-C$ | $-L_3$ |
| $-L_3$ | $-L_3$ | $C$ | $-L_3$ |
| $-L_3$ | $-L_3$ | $-C$ | $-L_3$ |

*Fig. 9*

| LEVELS | 3-BIT REPRESENTATION | 6-BIT 2'S COMPLEMENT FORM |
|---|---|---|
| 8.5 | 011 | 010001 |
| 3.5 | 010 | 000111 |
| 1.0 | 001 | 000010 |
| 0 | 000 | 000000 |
| -1.0 | 101 | 111110 |
| -3.5 | 110 | 111001 |
| -8.5 | 111 | 101111 |

Fig. 13

LOW COMPLEXITY FINITE PRECISION DECODERS AND APPARATUS FOR LDPC CODES

RELATED APPLICATION

The present application claims priority of provisional Patent Application No. 61/278,757 filed Oct. 9, 2009, which is incorporated herein in its entirety by this reference.

STATEMENT REGARDING FEDERALLY SPONSORED RESEARCH OR DEVELOPMENT

This invention was made with government support under grant numbers 0725405, 0325979, and 0634969 awarded by the National Science Foundation. The United States Government has certain rights in the invention.

BACKGROUND OF THE INVENTION

1. Field of Invention

The present invention is related to iterative decoding of LDPC codes represented by finite-length graphs. Specifically, the invention deals with low-complexity quantized decoders for LDPC codes that have potential to outperform the floating-point BP decoder on a finite-length graph.

2. Description of the Related Art

Error-correcting codes are indispensable for any modern digital communication system which requires reliable transmission and/or storage of digital data. A class of error-correcting codes called low-density parity-check (LDPC) codes, that were originally discovered by Gallager in the 1960's and rediscovered some thirty years later, have sparked a widespread interest in the field of coding theory. These codes are based on the principle of iterative decoding (or message-passing) and were shown to asymptotically perform close to the theoretical limit established by Shannon's noisy channel coding theorem. The standard BP decoder or modified versions of it are mostly commonly used for decoding LDPC codes and carried out on the graph representations of the code. The remarkable performance of LDPC codes as well as their simple and efficient high-speed implementations have made them very attractive for use in a plethora of applications ranging from wireless communication and deep-space communication systems to magnetic storage media.

In the past few years, a considerable amount of research has been dedicated towards constructing LDPC codes that have good distance properties, and finding better iterative decoders that enable simpler hardware implementations as well as have good asymptotic performance. Richardson et. al. in proposed the technique of density evolution under BP decoding in order to determine the asymptotic decoding threshold of a particular code and suggested using this analysis in order to optimize the code's profile for the best possible decoding threshold. Although the density evolution approach can provide a fairly accurate prediction of the performance of a code in the very low signal-to-noise ration (SNR) region (or waterfall region), it cannot predict in the higher SNR region (or error floor region). This can be attributed to the fact that the density evolution approach does not take into account the finite-length effects of the code since it assumes an infinite code length and the variable node considers the graph representation of the code to be a tree. Therefore, BP decoding is suboptimal for practical implementations of LDPC codes. It was also observed by MacKay et. al. in that certain LDPC codes that had a fairly good minimum distance exhibited relatively high error floors in their performance. Error floor is an undesirable phenomenon of iterative codes in general, that is said to have occurred when the performance curve of a given code flattens out thus exhibiting an almost fixed error rate even at high SNR. MacKay et. al. attributed this phenomenon to certain potentially harmful structures in the graph representation of the LDPC code called near-code words, and later Richardson formally introduced them in as trapping sets where the decoder failed to converge to a codeword for certain low-weight error patterns. These trapping sets can be present in any finite-length code even though it has been optimized for a good decoding threshold. Hence, LDPC codes that are optimized using the density evolution approach can still exhibit high error floors.

The class of quantized decoders, where only a fixed number of bits are allowed for representation of the messages, are also important to address when considering practical implementations due to hardware limitations. Some properties that are typically desirable for quantized decoders are simpler hardware implementations and minimal degradation in performance compared to the floating-point BP decoder. The prior art uses a quantized BP decoder with a quantization scheme that considerably simplifies the processing at the check node. The prior art also uses a quantization unit that determines a quantization width based on density evolution. Other works related to modifications of BP decoding for simpler implementations and use of the density evolution approach to find good quantized decoders can also be found in the literature. It must be noted that in all these works, there is still some degradation in the performance of quantized decoders compared to the floating-point BP decoder on finite-length graphs. The same issues also exist in inventions in the current state of the art for quantized decoders. Also for reasons mentioned in the previous paragraph, the loss can become even more significant when the code length is relatively small and the graph of the code is relatively dense. In essence, decoders obtained via the density evolution approach cannot guarantee good performance in the higher SNR region for a finite-length code.

There are notably two ways to deal with degradation of performance in the error floor region for an LDPC code. One way is to construct codes by avoiding certain trapping sets thereby increasing the guaranteed error-correction capability of the codes and improving the performance. The other way is to improve the iterative decoding process on a finite-length graph. The first approach has been extensively studied. However, it may not always be possible to avoid certain trapping sets during construction due to limitations established by the length of the code especially when considering short length codes with relatively higher code rates. The current invention closely follows the second approach with the added constraint of finite precision for representation of messages.

LDPC codes are linear codes that are characterized by a sparse parity check matrix H containing a small number of nonzero entries. These codes can be conveniently represented by bipartite graphs called Tanner graphs, which are more useful representations when carrying out the iterative decoding process. The Tanner graph representation of an LDPC code includes two sets of nodes. One set of nodes are called variable nodes and they represent the bits associated with a codeword. The other set of nodes are called check nodes and they represent parity check constraints on the bits of the codeword which are defined by the parity check matrix H. An edge of the graph connects a variable node to a check node only if that particular bit represented by the variable node participates in the parity check equation represented by the check node. The number of nonzero entries in a column of parity check matrix determine the degree of a particular variable node and the number of nonzero entries in a row determine the degree of a check node. Regular LDPC codes are codes for which all the variable nodes have the same degree and all check nodes have the same degree, whereas irregular LDPC codes can have different degrees for different nodes. Regular LDPC codes are typically denoted as $(d_v, d_c)$ codes, where $d_v$ is the degree of a variable node and $d_c$ is the degree of a check node. FIG. 1 shows the example of a tanner graph for a rate-half (3, 6) binary LDPC code with code length 8, and its corresponding parity check matrix.

The circles on the Tanner graph denote variable nodes and the boxes denote check nodes. The vector x includes bits $b_1$ to $b_8$ that are associated to their corresponding variable nodes $v_1$ to $v_8$ on the Tanner graph. x is a codeword if and only if it satisfies the matrix product, $Hx^T=0$ (satisfiability condition). This implies that every row of the parity check matrix H corresponds to a parity check constraint on the bits of a codeword. For example, the check node $c_1$ on the Tanner graph represents the parity check equation corresponding to the first row of the parity check matrix, and the bits associated to the neighboring variable nodes $v_1, v_2, v_3, v_4, v_5,$ and $v_7$, are involved in the parity check equation. This means that the bits associated to these variable nodes must satisfy the parity check equation $b_1+b_2+b_3+b_4+b_5+b_7=0$ (mod 2). In general, all the bits represented by the variable nodes that are connected to a particular check node must add up to zero modulo 2, and under such condition, the check node is considered to be satisfied. If the parity check equation does not hold, then the check node is considered to be unsatisfied.

For a given message vector m, the encoding process of LDPC codes can be done by deriving the generator G from H using the method of Gaussian elimination and performing the matrix multiplication mG. For decoding of LDPC codes, a message-passing algorithm is carried out on the Tanner graph of the code and messages are iteratively passed between variable nodes and check nodes along the edges of the graph. FIG. 2 illustrates the entire coding process which involves encoding a given message vector m, modulating the binary data, transmitting it across the channel which introduces errors, demodulating the signal, and then performing decoding on the received message to recover the original data.

Several message-passing algorithms exist in the state of art that are used for decoding LDPC codes. Simple low-complexity algorithms such as Gallager-A and Gallager-B algorithms utilize only hard information from the channel, i.e., the decoder receives only binary data from the channel as its input and a single bit is used to represent messages. These can be regarded as 1-bit decoders. Whereas more complex algorithms such as the BP algorithm utilize soft information from the channel where floating-point values are used to represent messages. As mentioned in the previous section, there are many modified versions of the BP decoder that have been suggested in the literature in order to simplify the decoding operations for hardware implementation, as well as quantized versions of BP decoding that use a fixed number of bits to represent the soft values. The Gallager-B and the BP algorithms are briefly described in order to make note of the distinction between multilevel decoders defined in this invention and existing state of the art decoders, since most of the existing message-passing decoders in the state of the art are related to these traditional message-passing algorithms.

Any message-passing algorithm for LDPC codes can be described by defining an update rule at the variable node and an update rule at the check node. The variable node update rule and the check node update rule can be denoted as functions $\psi_v$ and $\psi_c$ respectively, that are used to determine the outgoing messages. Initially, every variable node $v_i$ calculates its channel value $y_i$ based on the observation value $r_i$ that is received from the channel. For the Gallager-B algorithm the channel value $y_i$ is simply $r_i$ which is a single binary bit received from the channel in the case of the binary symmetric channel (BSC), and the value $y_i$ is simply the sign of $r_i$ in the case of other channels such as additive white Gaussian noise (AWGN) channel. For the BP algorithm implemented in the "log-likelihood domain", the channel value y is a log-likelihood ration calculated from the observation $r_i$. Assuming that a transmitted bit $b_i$ can be a zero or one with equal probability the value $y_i$ can be calculated as $$\log\frac{p(r_i \mid b_i = 0)}{p(r_i \mid b_i = 1)}$$

Where $p(r_i|b_i=a)$ is simply the probability of receiving observation value $r_i$ conditioned on the transmitted bit $b_i$ being the value of a. The calculation of $y_i$ depends on the type of channel and noise distribution.

Initially, all messages are set to zero and the variable node $v_i$ receives only the channel value $y_i$. The variable node $v_i$ simply sends this channel value $y_i$ as its outgoing message to all its neighboring check nodes in the first iteration. At the check nodes, the check node update rule $\psi_c$ is used to determine the outgoing messages and the messages are passed to the variable nodes. At the variable node, the variable node update rule $\psi_v$ is used to determine the outgoing messages, and in this manner messages are iteratively passed between variable nodes and the check nodes. Note that while determining the outgoing message on any particular edge of a variable or check node, the message on that particular edge is not included in the computation of the outgoing message. For example, if an outgoing message is being calculated on a particular edge of a node $v_i$ whose degree is $d_v$, then the number of incoming messages used in the function $\psi_v$ during computation is $d_v-1$. This is to ensure the message is an extrinsic message and the dependencies between the messages entering the node are reduced. Computing the extrinsic message during an update at a particular node is a general principle that must be adhered to for any kind of message-passing decoder. For the Gallager-B algorithm, the variable node update and check node update rules are defined as $$\psi_v(y_i, m_1, \ldots, m_{d_v-1}) = \begin{cases} 1, & \text{if the number of incoming messages that are one} \geq b_{1,d_v} \\ 0, & \text{if the number of incoming messages that are zero} \geq b_{1,d_v} \\ y_i, & \text{otherwise} \end{cases}$$

$$\psi_c(m_1, m_2, \ldots, m_{dc-1}) = \left(\sum_{i=2}^{d_c-1} m_i\right) \bmod 2$$

The value $b_{l, dv}$ is a threshold value used in update rule of variable node $v_i$ with degree $d_v$ during the $l^{th}$ iteration of the decoding process. The threshold can change from iteration to iteration but is typically chosen to be a majority value for practical implementations. The Gallager-A algorithm is a special instance of Gallager-B where $b_{l, dv}=d_v-1$. For column-weight three LDPC codes, both algorithms are equivalent. For the BP algorithm, the variable node update and check node update rules are defined as $$\psi_v(y_i, m_1, m_2, \ldots, m_{d_v-1}) = \left(\sum_{j=1}^{d_v-1} m_j + y_i\right)$$

$$\psi_c(m_1, m_2, \ldots, m_{d_c-1}) = 2\tanh^{-1}\left(\prod_{j=1}^{d_c-1} \tanh\left(\frac{m_j}{2}\right)\right)$$

In the definitions, the symbol $$\sum_{j=1}^{d_v-1}$$

denotes the sum operator used to add up to $d_v-1$ terms and the symbol $$\prod_{j=1}^{d_c-1}$$

denotes the product operator used to determine the product of $d_c-1$ terms indexed by j. These symbols are reused throughout the specification as required.

At the end of each iteration in the decoding process, a hard decision rule is carried out at the variable node which determines whether the bit $b_i$ associated to the node $v_i$ is a one or a zero based on the values of the incoming messages and the channel value $y_i$. For the Gallager-B algorithm bit $b_i$ is decided by comparing the number of ones and zeros to a set threshold in a similar fashion to the variable node update rule. For the BP algorithm the bit $b_i$ is decided by taking the sum of all the incoming messages to the variable node and the channel value, and observing the sign of the result. Assuming that the modulation scheme uses the typically binary map $0 \to 1$ and $1 \to -1$, a positive sign indicates the $b_i$ to be zero and a negative sign indicates the bit $b_i$ to be one. These bits obtained from the hard decision rule are then sent to the check nodes along the edges of the graph in order to verify if all the check nodes are satisfied. If all check nodes are satisfied, the decoder has converged to a codeword and the iterative process is terminated. Else the decoder has failed to converge and the iterative process is continued until a maximum number of iterations is reached. In practice, note that performing the hard decision rule is essential only after the maximum number of iterations has been reached. Some implementations of state of art decoders prefer running the decoder for a given number of iterations all the time and performing the hard decision at the end of the decoding process without checking if the decoded output is a codeword or not. However, performing the decision rule after every iteration can increase the speed of the decoder significantly since the algorithm starts to converge much more quickly as the SNR increases and the average number of iterations required for convergence will be much lesser compared to the maximum number of iterations. Also knowledge on whether the decoder failed or not can be useful to exploit when considering using multiple decoders to correct certain error patterns as shall be expounded in the detailed description of the current invention. The concept of trapping sets is now described since they remain central to our method used to obtain the multilevel decoders in the invention. Henceforth for convenience, the bits represented by the variable nodes are referred to as the nodes themselves.

Trapping sets are small subgraphs present in the Tanner graph of the code that cause the decoder to fail for certain noise configurations or low-weight error patterns. Following the definition given by Richardson, given a decoder, a trapping set is defined as a subgraph induced by the set of variable nodes that eventually failed to decode to the right bits for a particular decoder input. In other words, these trapping sets are subgraphs containing variable nodes that either remain trapped to the wrong value or oscillate between the right and wrong value due to a specific noise configuration on the Tanner graph. The decoder failure on the subgraph is instigated by certain variable nodes in the Tanner graph that initially received bad (or extremely wrong) values from the channel due to a particularly bad noise configuration. Typically in the high SNR region, the number of variable nodes initially receiving bad channel values is quite small thus contributing to the error floor phenomenon. A particular subgraph can potentially be a trapping set depending on the channel, decoder input and the decoder itself.

For symmetric decoders and output-symmetric memoryless channels, the all-zero codeword can be assumed to be transmitted in order to simplify analysis on trapping sets. However, for asymmetric channels, and channels with memory such as magnetic recording channels, all code words must be used for analysis. A popular notation used to describe trapping sets is the (a,b) notation where a denotes the number of variable nodes in the induced subgraph and b denotes the number of odd-degree check nodes present in the induced subgraph. As an example, FIG. 3 shows how the Gallager-A algorithm fails on the (5,3) trapping set for the BSC. The variable nodes $v_1$, $v_2$ and $v_3$ are initially in error (they are all ones) and the variable nodes $v_4$ and $v_5$ are initially correct (they are both zeros). The arrows indicate a one being transmitted from one node to the other. FIG. 3(a) illustrates the message passing from variable node to check node in the first half of iteration one. The nodes $v_1$, $v_2$ and $v_3$ transmit a 1 on all its edges to the check nodes $c_1, \ldots, c_9$. In the second half of iteration one, nodes $v_4$ and $v_5$ receive a 1 on all its edges as shown in FIG. 3(b). In the first half of iteration two, due to the variable node update rule for Gallager-A, nodes $v_4$ and $v_5$ send a 1 on all its edges as shown in FIG. 3(c). Finally at the end of iteration two, nodes $v_1$, $v_2$ and $v_3$ receive two 1's and one 0 as shown in FIG. 3(d) and the process repeats itself in the next iteration thus resulting in a decoder failure. For the BP algorithm, the trapping sets typically contain many short cycles that are interconnected to each other in the subgraph and this causes the message-passing process of the BP algorithm to be faulty leading to decoder failure. This can cause considerable degradation in frame error rate (FER) performance of the code in the high SNR region even though the code may have a fairly good minimum distance and good decoding threshold. The codeword error rate or frame error rate gives us a measure of how likely an estimated/received codeword (or frame) will be in error and this is typically a function of SNR. Note that even if a single bit in the codeword is erroneous, the whole codeword is considered to be erroneous. The main goal of any code or decoder is to lower the FER as much as possible. As previously mentioned in the background, even codes with good properties such as good minimum distance can exhibit a high error floor due to presence of trapping sets in the finite-length graph. Therefore, improving the decoding by reducing failure rates on trapping sets is a key strategy in improving the performance in the error floor region.

SUMMARY OF THE INVENTION

According to the present invention, a new class of quantized decoders called multilevel decoders where the messages are quantized to certain levels is presented. These decoders are obtained with the purpose of improving the message-passing process on finite-length graphs as BP decoding is suboptimal on finite-length graphs. This is carried out by using certain subgraphs as combinatorial objects that could potentially be trapping sets and deriving multilevel decoders that reduce the failure rate on these subgraphs. Hence, these decoders have the potential to outperform the floating-point BP decoder in spite of using finite precision to represent messages. At the same time these decoders greatly simplify the hardware implementation without compromise in performance. Included as part of this invention are 3-bit decoders, i.e., decoders that use only 3 bits to represent messages, that were specifically designed for column-weight three LDPC codes in order to demonstrate the efficacy and potential of this class of decoders. Column-weight three LDPC codes are chosen as examples because these codes constitute one of the simplest classes of LDPC codes for implementation and therefore assume practical importance. But the decoders defined in the manner described in this invention are not limited to column-weight three codes. It must also be noted that during implementation, in contrast to other state of the art decoders the present invention does not use soft values (fixed point or floating point values) to represent the messages, but rather binary vectors.

According to the present invention, a new class of finite precision multilevel decoders, and decoding methods and apparatus directed towards such decoders is presented. This newly defined class of decoders has the potential to outperform the floating-point BP algorithm but at the same time has much lower complexity than existing state of art decoders. The methodology used to obtain the decoders in this invention is based on reducing failure rates on potential trapping sets thereby improving the performance on a finite-length graph. For this class of decoders, a specifically defined message update function is used to update messages at the variable node, and the simple min operation along with modulo 2 sum of signs is used to update messages at the check node. Using the concept of decoding on isolated subgraphs (that could potentially be trapping sets), the methodology involves decoding on a set of subgraphs using a set of defined variable node update functions. These functions can also be considered as simple variable node update look-up tables. The best possible update function is chosen based on the failure parametrization of these subgraphs for each update function.

Using the methodology, as examples, methods and apparatus for 3-bit decoders that use 7 levels and 5 levels for column-weight three LDPC codes are provided. General schematics for implementations of the variable node processing and check node processing of the decoder are also provided. Provisions are also made in this invention for the use of multiple update functions at the variable node that can be used sequentially or parallely or both depending on the hardware constraints. The use of multiple decoders is effective for finite-length codes that have dense graphs in order improve the guaranteed error-correction capability of the code.

Numerous variations on the method and apparatus of the present invention are possible and likely. All variations with regards to implementations are considered within the scope of this invention. The modules used to implement the present invention may be implemented as software, hardware, firmware, or as a combination of software, hardware and firmware. Possible applications of the present invention include (but are not limited to) wired and wireless communications systems such as fiber optics, free-space optical communications, underwater communications, satellite communications, deep-space communications, and also data storage systems such as magnetic hard drives and magnetic tapes, optical storage systems, memory systems used in computers and other devices such as solid state devices.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 6 is a look-up table corresponding to an update function $\Phi_{v1}$ according to the present invention;

FIG. 7 is a look-up table corresponding to an update function $\Phi_{v2}$ according to the present invention;

FIG. 8 is a look-up table corresponding to update function $\Phi_v$ of a 5-level nonlinear-threshold decoder;

FIG. 9 is a look-up table corresponding to the update function $\Phi_v$ of a 7-level nonlinear-threshold decoder;

FIG. 13 is a table showing conversion of a 3-bit binary vector to 6-bit 2's complement form according to the present invention;

DETAILED DESCRIPTION OF THE INVENTION

Figure 1:
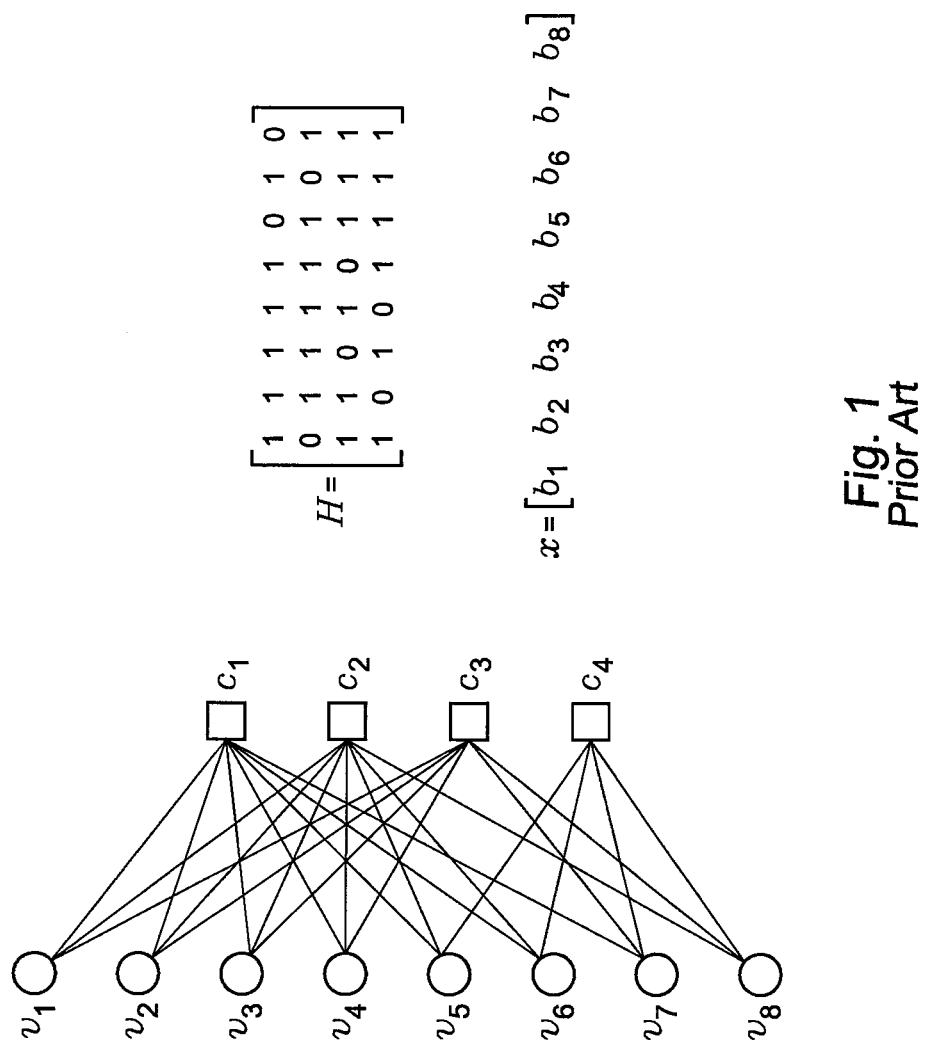
FIG. 1 shows the example of a tanner graph for a rate-half (3, 6) binary LDPC code with code length 8, and its corresponding parity check matrix according to the prior art.
Figure 2:
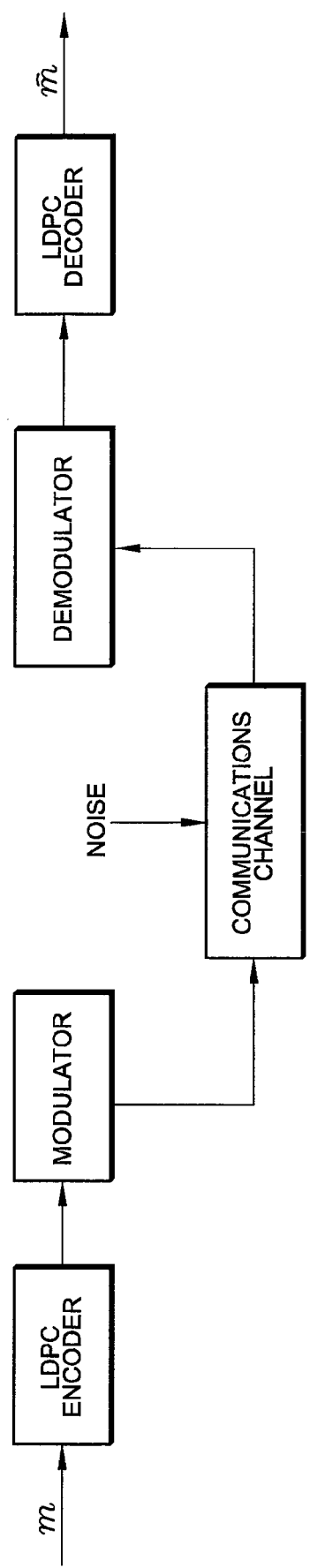
FIG. 2 illustrates the entire coding process which involves encoding a given message vector m, modulating the binary data, transmitting it across the channel which introduces errors, demodulating the signal, and then performing decoding on the received message to recover the original data according to the prior art.
Figure 3:
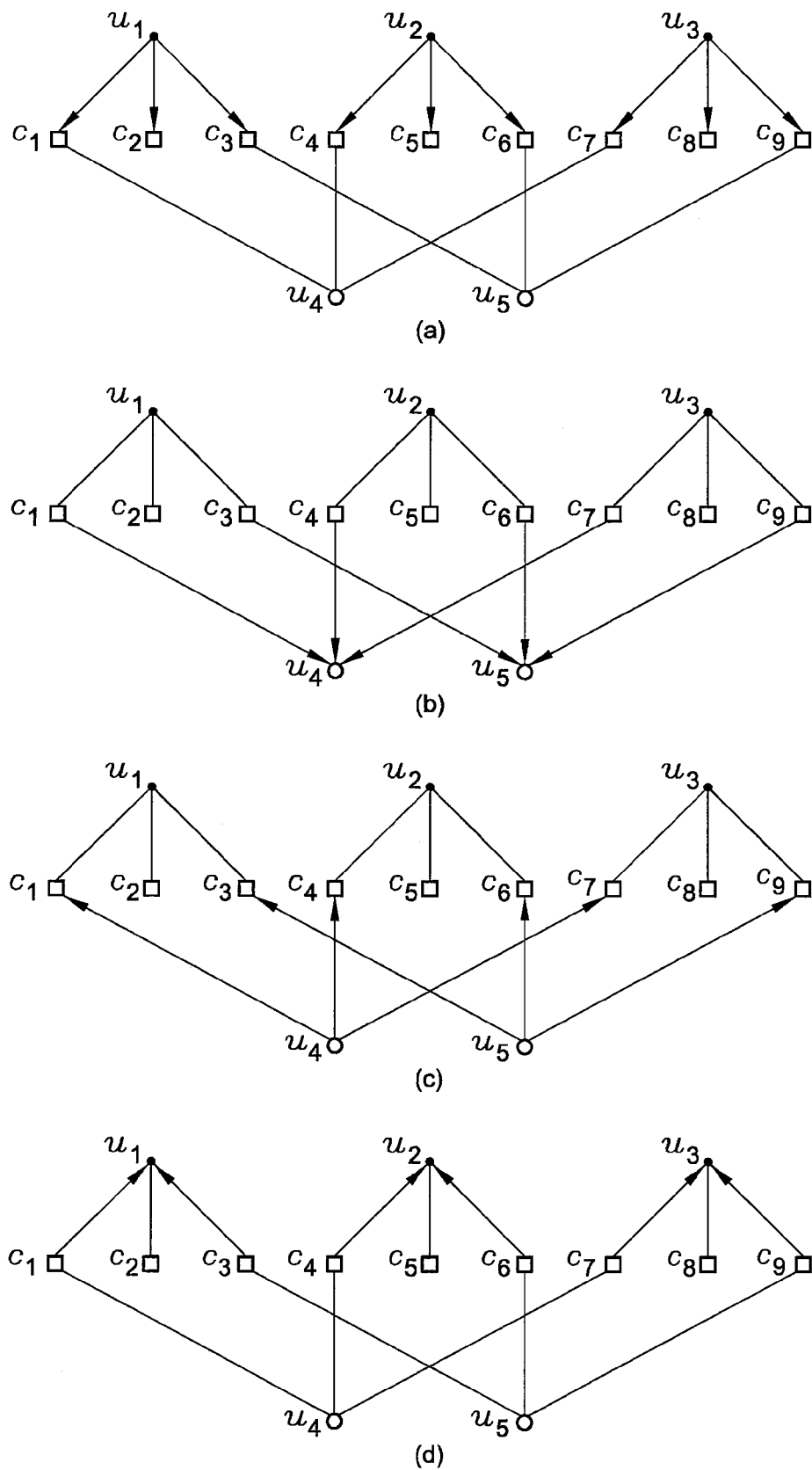
FIG. 3 shows how the Gallager-A algorithm fails on the (5,3) trapping set for the BSC (Binary Symmetric Channel) according to the prior art.

As previously discussed, the description of this new class of multilevel decoders is considered to be the foremost component of the present invention. Hence, definitions and an algebraic description for multilevel decoders are provided. The methodology used to obtain good multilevel decoders and provide apparatus for 3-bit decoders as specific examples, which constitute the remaining components of the present invention are also provided.

Multilevel decoders are a subclass of quantized decoders for which the messages propagated on the graph are confined to a message set $M=\{-L_k, \ldots, -L_2, -L_1, 0, L_1, L_2, \ldots, L_k\}$ where each $L_i \in M$ is a strictly positive value. The sign of a message $x \in M$ represents the message's belief of the whether the bit is zero or one and the magnitude of x denoted as |x| represents the reliability measure of its belief. Also M is defined such that $L_i > L_j$ for any $i > j$. The cardinality of M denoted by $|M|=2k+1$ is based on the number of levels used, and the maximum number of levels that can be used is constrained by the number of finite precision bits allowed for representing the messages.

For each variable node, the channel value $y_i$ which is determined based on the observation value received from the channel, is a value belonging to a set Y called channel output set that is defined as the set of quantized outputs of any output-symmetric channel. The channel value $y_i \in Y$ represents the channel's belief of a variable node and its reliability measure. Based on the above definitions, it is evident that the quantization process can be considered as a two-fold process: quantization of channel value and quantization of messages. Quantization of channel involves defining the set Y and defining the necessary thresholds that determine the channel value from the given set of values in Y. Quantization of messages involves defining the set M and the necessary thresholds that determine the messages to be passed on the graph. For the special case of BSC channel, since the channel output is already quantized to two levels (zero or one), only a reliability measure needs to be assigned. Hence, the set Y is defined as $Y=\{-C,+C\}$, where C denotes the reliability measure that is assigned to the channel, and is strictly positive. In other words, C gives a measure of how much the decoder should rely on the channel. For other channels, the set Y may contain more levels with the maximum number again being constrained by the number of finite precision bits allowed.

Similar to any other traditional message-passing algorithm, a multilevel decoder can be uniquely defined by specifying the update functions used at the variable nodes and check nodes. Although multilevel decoders in general can have update functions that are iteration-dependant (change from iteration to iteration) and node-dependent (different functions from different nodes), for the sake of simple exposition the detailed description is restricted to iteration-independent and node-independent multilevel decoders. This means that all variable nodes use the same variable node update function and all check nodes use the same check node update function throughout the entire decoding process. The update functions for the variable node and check node described as part of this invention can be applied for any LDPC code with a fixed column-weight and irregular/regular row weight (also called left-regular LDPC codes), and are defined in this setting. Note however, that the definitions can also be extended to irregular codes where different update functions are used for different nodes. Let $\Phi_v$ denote the variable node update function and $\Phi_c$ denote the check node update function. If $d_c$ is the degree of a particular check node and $m_1, m_2, \ldots, m_{d_c-1}$ are incoming messages to the check node (excluding the edge for which the outgoing message is being determined). Then for this class of decoders, the check node update function $\Phi_c$ is defined as $$\phi_c(m_1, m_2, \ldots, m_{d_c-1}) = \left(\prod_{j=1}^{d_c-2} \text{sgn}(m_j)\right) \min_{j \in (1,\ldots d_c-1)} (|m_j|)$$

Where sgn denotes the standard signum function. It must be mentioned at this point that in the limit of high SNR, the BP algorithm becomes the min-sum algorithm and the check node update rule $\psi_c$ for BP is modified to be exactly $\Phi_c$. Hence, the min-sum algorithm and the multilevel decoders defined in this invention use the same check node update function. However, the difference in the two decoding algorithms lies in the definition of the variable node update function. Note that for the BP algorithm and the min-sum algorithm, the variable node update function is just a linear sum of the incoming messages.

The variable node update function $\Phi_v$ can be defined as a closed-form function of the incoming messages or a simple look-up table. For an LDPC code with column-weight $d_v$, let $m_1, m_2, \ldots, m_{d_v-1}$ denote the incoming messages to a particular variable node $v_i$ (excluding the edge for which the outgoing message is being determined and let $y_i \in Y$ be the channel valued. Clearly $\Phi_v$ is a function of $m_1, m_2, \ldots, m_{d_v-1}$ and $y_i$. Based on the definition of $\Phi_v$, multilevel decoders are classified into two distinct subclasses: linear-threshold decoders and nonlinear-threshold decoders.

Linear-threshold decoders are multilevel decoders for which the function $\Phi_v$ is a linear-threshold function. A linear-threshold function is a function that determines its output by taking a linear combination of its inputs and comparing with a set of thresholds. A threshold set is defined as $\tau=\{T_1, T_2, \ldots, T_k\}$ with cardinality k and the elements of $\tau$ correspond to the different thresholds used to determine the outgoing message, i.e., any element $T_p \in \tau$ corresponds to the threshold used to decide if the outgoing message is $L_p$ where $L_p \in M$. Also $\tau$ is defined in such a way that for any $T_p, T_q \in \tau, T_p > T_q$ if $p > q$. Using a quantization function Q, the function $\Phi_v$ is defined as $$\phi_v(y_i, m_1, m_2, \ldots, m_{d_v-1}) = Q\left(\sum_{j=1}^{d_v-1} m_j + y_i\right)$$

Where the quantization function Q is defined as $$Q(x) = \begin{cases} L_i, & T_i \le x < T_{i+1} \\ -L_i, & -T_{i+1} < x \le -T_i \\ 0, & \text{otherwise} \end{cases}$$

where $i = 1, 2, \ldots, k$ and $T_{k+1} = \infty$

Based on this definition, the function $\Phi_v$ for linear-threshold decoders can be uniquely and completely specified by defining the threshold set τ, the channel output set Y and appropriately choosing the values of the messages belonging to the set M. Note that in the definition of $\Phi_v$, the values of $L_i \in M$, $y_i \in Y$, $T_i \in \tau$ can assume positive real values. However, when considering actual implementation, the messages will be strictly represented by finite precision bits which will be explained in detail while describing implementations and apparatus. $\Phi_v$ can also be completely specified by setting constraints on the possible values of the messages in set M and thresholds that characterize a unique update table, and this algebraic representation can be useful for finding good multilevel decoders as well as for implementation. From this definition of $\Phi_v$, linear-threshold decoders can be considered as special instances of a general quantized min-sum decoder which is essentially the traditional min-sum algorithm that was previously described followed by the use of the quantization function. However, the main difference between existing quantized min-sum decoders and the linear-threshold decoders described in the present invention is the particular quantization schemes used in these decoders, i.e., the particular message sets and threshold sets used to defined $\Phi_v$ in the present invention are derived based on the knowledge of potential trapping sets. Hence, for reasons cited in the background section, the linear-threshold decoders in this invention improve the message-passing process on a finite-length graph and therefore have potential to outperform even the floating-point BP algorithm.

Nonlinear-threshold decoders are decoders for which the function $\Phi_v$ is a nonlinear-threshold function. A nonlinear-threshold function is a function that decides its output by taking a nonlinear combination of its inputs and comparing with a set of thresholds. Due to nonlinearity used in the function, the function $\Phi_v$ can output different outgoing messages for any two distinct sets of incoming messages even though the sum of them is the same. This is a clear difference from linear-threshold decoders where any set of incoming messages to the variable node will always output the same outgoing message if their sum remains the same. Hence these decoders are different from quantized min-sum decoders or any other existing quantized message-passing decoders. The nonlinear-threshold function can be conveniently described algebraically by assigning a weight $w_c$ to the channel value $y_i$ and the value $w_c$ is computed using some nonlinear function $\Omega$. The channel weight function $\Omega$ can be described as a closed-form function (if possible) or as a simple look-up table that gives the optimal channel weights for every possible set of incoming messages. For non-linear threshold decoders, $\Phi_v$ is defined as $$\phi_v(y_i, m_1, m_2, \ldots, m_{d_v-1}) = Q\left(\sum_{j=1}^{d_v-1} m_j + w_c \cdot y_i\right)$$

Where Q is the quantization function and $w_c = \Omega(m_1, m_2, \ldots m_{d_v-1})$. Note that nonlinearity of the function $\Phi_v$ is captured in the computation of $w_c$ and is still computed as the algebraic sum of the messages as in the case for linear-threshold decoders. From the definition of $\Phi_v$, it is evident that the channel weight function $\Omega$ needs to be defined in addition to the message set M, threshold set τ and channel output set Yin order to completely specify the non-linear threshold function $\Phi_v$. Again similar to the case of linear-threshold decoders, a set of constraints on the possible values of the messages in set M and thresholds can be used instead of actually defining a particular message set M and threshold set τ. This shall be subsequently explained in greater detail.

The variable node update function $\Phi_v$ for multilevel decoders can also be defined in such a way that both linear-threshold decoders and nonlinear-threshold decoders are described using a single function with the help of the channel weight function $\Omega$. This can be defined as $$\phi_v(y_i, m_1, m_2, \ldots, m_{d_v-1}) = Q\left(\sum_{j=1}^{d_v-1} m_j + \Omega(m_1, \ldots, m_{d_v-1}) \cdot y_i\right)$$

Where the function $\Phi_v$ becomes a linear-threshold function if $\Omega(m_1, \ldots, m_{d_v-1}) = 1$ or some constant.

The previous description defined the class of multilevel decoder which is considered part of the present invention. The present invention includes multilevel decoders defined in this specific manner. The next part of the description focuses on the methodology for obtaining good multilevel decoders.

A general methodology is now presented that can be used to derive good multilevel decoders which were precisely defined as part of the present invention for a given number of finite precision bits allowed for representation. Since the check node update function is fixed for multilevel decoders, the design narrows down to specifying the function $\Phi_v$. If the number of bits allowed is n, the maximum number of levels that can be contained in set M is $2^n-1$. The methodology involves generating a database of all possible subgraphs that are potentially trapping sets and performing decoding on the isolated subgraphs using different variable node update tables under different error patterns. Although the methodology can be applied for any channel, as mentioned in the preliminaries section, the analysis of trapping sets must be carried using the entire list of code words for asymmetric channels or channels with memory. Hence, for simplicity the description is restricted to symmetric memoryless channels.

Figure 4:
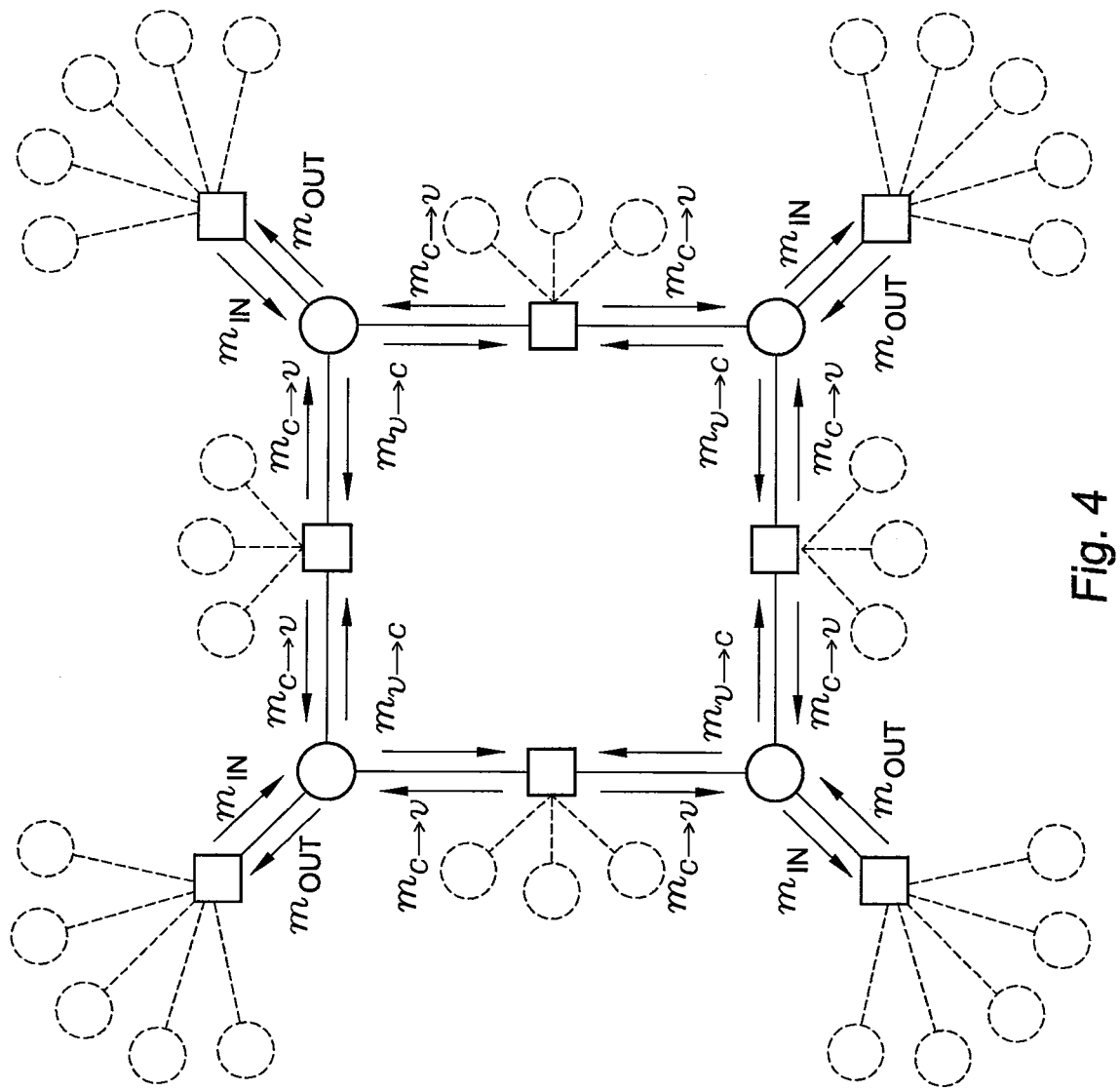
FIG. 4 illustrates the decoding on an isolated eight-cycle which is a potential (4,4) trapping set according to the present invention.

For such channels, decoding on an isolated subgraph is carried out assuming that the all-zero codeword is transmitted, and the decoding process is similar to decoding on a typical graph with the exception of the update rule for the degree-one check nodes in the subgraph. FIG. 4 illustrates the decoding on an isolated eight-cycle which is a potential (4,4) trapping set. The nodes with solid lines are the nodes that belong to the subgraph. The open boxes represent degree-2 check nodes and the filled boxes represent degree-one check nodes in the subgraph. Clearly the subgraph has 4 variable nodes and 4 degree-one check nodes, hence a (4,4) trapping set. The nodes with dotted lines represent the variable nodes outside the subgraph. In order to decode on an isolated subgraph, it is assumed that all the variable nodes outside the subgraph are initially correct (receive initially correct channel values) and that the neighborhood of the degree-one checks are completely isolated from each other. This means that the messages entering the subgraph through the degree-one check nodes are in no way affected by the messages propagated within the subgraph and the messages flowing out of the subgraph. In FIG. 4, $m_{v \rightarrow c}$ denotes messages going from variable node to the degree-2 check node and $m_{c \rightarrow v}$ denotes messages going from the degree-2 check nodes to the variable nodes, $m_{in}$ denotes the outgoing message from the degree-one check node to a variable node, which is a message entering into the subgraph. $m_{out}$ denotes the outgoing message from the degree-one check node to a variable node, which is flowing out of the subgraph. The messages $m_{v \rightarrow c}$ and $m_{out}$ are computed using specific variable node update table $\Phi_v$ and the message $m_{c \to v}$ is computed using the check node update function $\Phi c$. In order to compute $m_{in}$ at the end of every iteration, a different rule is needed assuming that all variable nodes outside the subgraph are initially correct. Let us assume this subgraph is present in a column-weight three code. By the isolation assumption on the neighborhood of the degree-one check nodes and by the all-zero codeword assumption, the degree-one check node in the subgraph will send the message $m_{in} = \Phi_v(x_{I-1}, x_{I-1}, C)$ into the subgraph during the $l^{th}$ iteration, where $x_{i-1}$ is the message passed from the degree-one check node into the subgraph in the $(I-1)^{th}$.iteration. The remaining variable nodes and degree-2 check nodes follow the usual update rules and the decoding process is continued. Based on the error pattern in the subgraph, certain variable nodes in the subgraph will be initially wrong but may eventually become right by choosing a good variable update table $\Phi_v$.

Figure 5B:
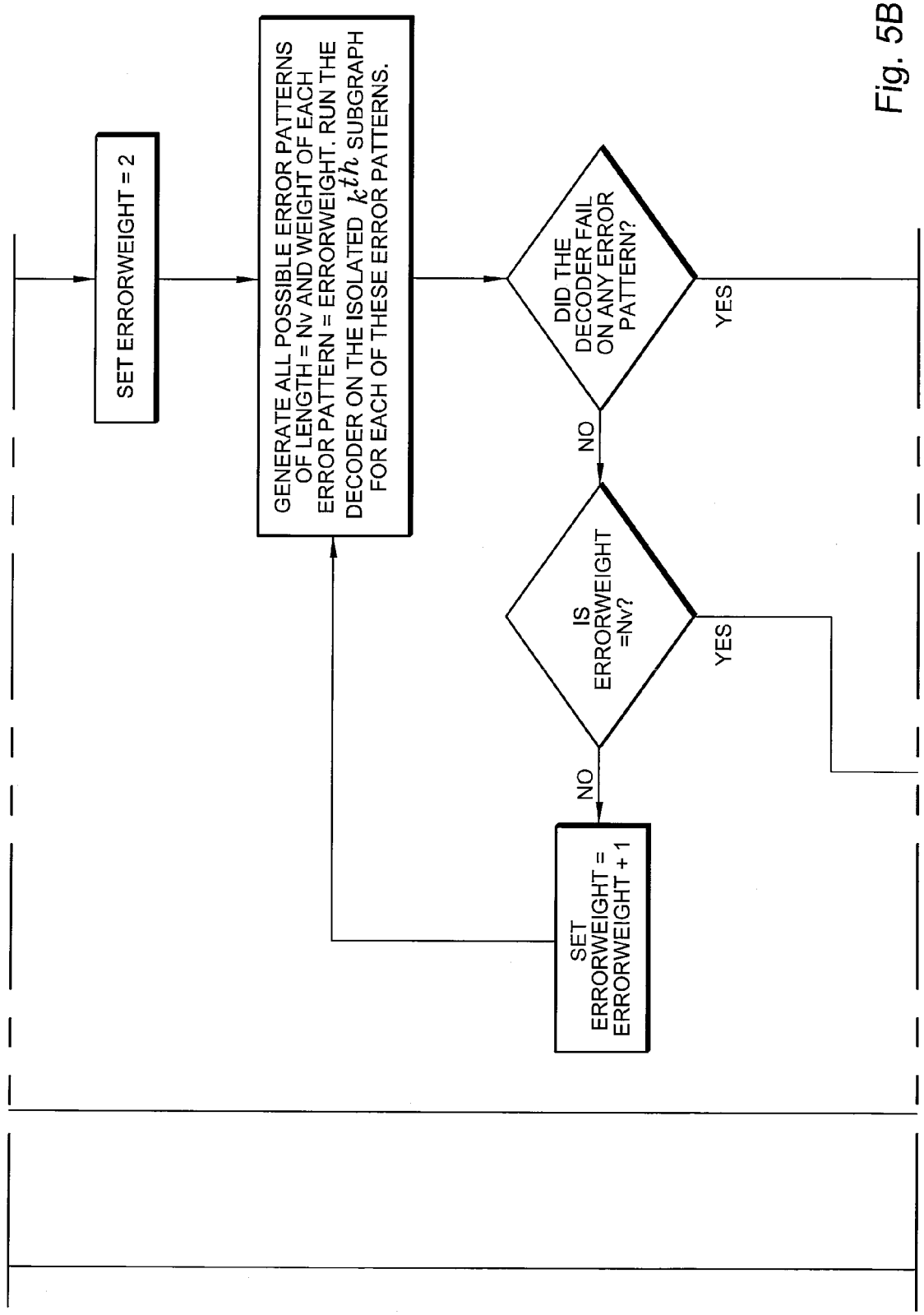
FIG. 5 provides a flow chart of the entire methodology for the BSC channel according to the present invention.
Figure 5C:
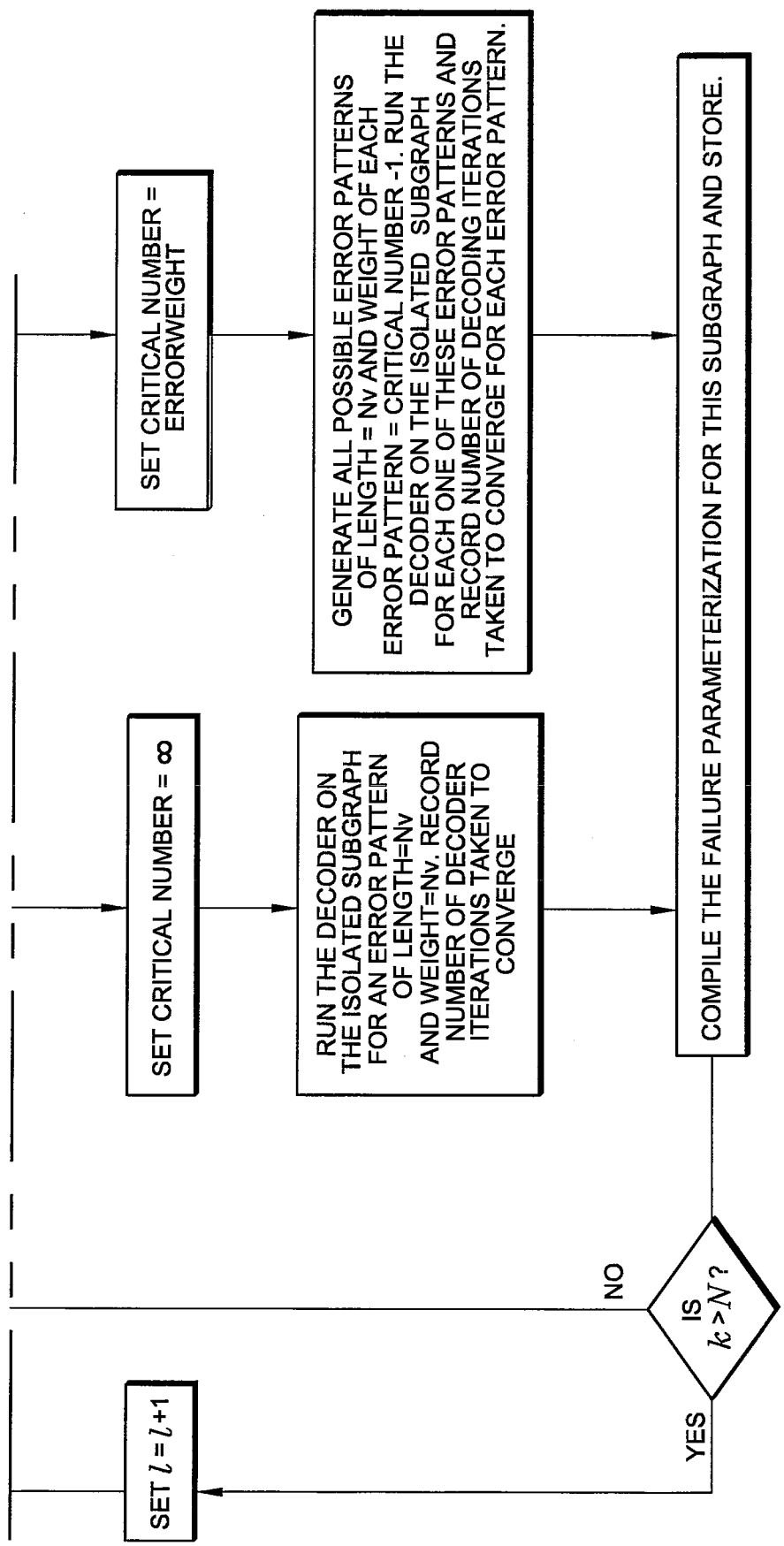

Using the technique of decoding on isolated subgraphs, the general method which is based on reducing failure rates on potential trapping sets can be summarized as follows. A database containing all possible subgraphs that are potential trapping sets is generated and called trapping set database. This database can be generated using analytical methods, by simulation or emulation of a decoder(s) on a given channel, or even by a combination of the simulation and analytical method. For example, the database could be generated by observing the failures in the high SNR region for a particular decoder or several decoders on a specific channel and use the subgraphs corresponding to these failures. Another way of generating the trapping set database is to construct the subgraphs combinatorially up to a certain size by setting constraints on the possible subgraphs based on some structural properties of trapping sets that are applicable to any decoder in general like the length of the shortest cycle of the subgraph (called girth). Or the database can be generated as previously mentioned by using a combinatorial construction algorithm and then further including some subgraphs associated with failures obtained during simulation of decoder(s). Essentially, the trapping set database contains subgraphs that have potential to be trapping sets for any given decoder and then decoders are found that have reduced failure rates on these subgraphs. In the case of the specific 3-bit decoders that were designed for column-weight three LDPC codes in the present invention, the trapping set database was generated by constructing all possible girth-8 subgraphs up to a certain size with the constraints that all check nodes have at most degree of 2 and all variable nodes have a degree of 3. Decoding is then performed on every isolated subgraph for a given error pattern in the subgraph using different variable node update functions (which are simply look-up tables). A failure parameterization is determined for each and every subgraph and the best variable node update table for a fixed number of levels in M is chosen based on the failure parameterizations of all the subgraphs in the database. The failure parameterization can be considered as a basic measure of the failure rate of a given decoder on these trapping sets if they were actually present in a finite-length graph. The failure parameterization can include parameters such as highest-weight error pattern the decoder can correct in the subgraph and the number of decoding iterations it takes to correct the lower-weight error patterns. Note that for soft-output channels such as AWGN, these error patterns will contain soft values. For the BSC channel, the failure parameterization used in the invention includes the critical number along with the number of decoding iterations taken to correct error patterns of weight equal to critical number −1. The critical number for a trapping set in the BSC channel is defined as the minimum weight required in the error pattern to cause the decoder to fail on the trapping set. For other channels such as AWGN, the failure parameterization may contain additional variables apart from weight of the error pattern since the error patterns will contain soft values. FIG. 5 provides a flow chart of the entire methodology for the BSC channel. For this case, the decoders that have maximum possible critical number on a subgraph and take lesser iterations to correct the low-weight error patterns are chosen as the best possible decoders. A critical number=∞ on a particular subgraph implies that the decoder will converge even if all the variable nodes in the subgraph are initially wrong.

In FIG. 5, T is the total number of variable node update functions being considered and N is the total number of subgraphs present in the trapping set database. Note that for multilevel decoders using a much larger message set M, a larger trapping set database must be used in order to determine the best possible decoder. The decoders obtained using the methodology have higher guaranteed error-correction capabilities compared to standard quantized decoders. Note that the flow chart can be modified for other channels by incorporating more parameters into the failure parameterization of a particular trapping set depending on the application. For example, some application may desire minimizing the number of residual errors in a message after decoding instead of the FER performance. Alternatively, it may be desirable in some application such as image processing to maximize the number of correct message bits before the first error occurs. Depending on the application, the methodology may be used by modifying the failure parameterization accordingly. Although the basic methodology has been provided, there are many variations possible related to the search algorithm especially when considering decoders with higher levels, and also with respect to relaxing some of the assumptions such as the isolation assumption in order to improve the efficacy of the method. But all variations based on this underlying general methodology are considered within the scope of this invention.

The next part of the description is focused on the specific 3-bit decoders and their implementations.

The description and apparatus for 3-bit decoders that were derived based on the methodology that was just described is now presented. More specifically, the apparatus for a 7-level linear-threshold decoder, a 7-level nonlinear-threshold decoder, and a 5-level nonlinear-threshold decoder is now presented. The 7-level linear-threshold decoder also serves as an example of including the flexibility and the strategy of using multiple variable node update functions in the decoder in order to improve the guaranteed error-correction capability of the code especially on denser finite-length graphs.

For the 7-level decoder, the message set includes seven levels and is defined as $M=\{-L_3,-L_2,-L_1,0, L_1, L_2, L_3\}$ and the threshold set is defined as $Z=\{T_1,T_2,T_3\}$. In the algebraic description, it was already mentioned that setting constraints on the possible values of $L_i$ and thresholds $T_i$ is sufficient to uniquely specify the variable node update function $\Phi_v$ instead of actually assigning values to $L_i$ and $T_i$ that define sets M and Z. This approach is used to specify the variable node update function $\phi_v$. The 7-level linear-threshold decoder according to the present invention uses two variable node update functions $\Phi_{v1}$ and $\Phi_{v2}$. Initially the decoder uses $\Phi_{v1}$ as the variable node update rule and if it fails to converge after maximum number of iterations then the decoder starts from the beginning using $\Phi_{v2}$ as its variable node update rule instead of $\Phi_{v1}$. In essence, $\Phi_{v2}$ is used only on the failures of the decoder with $\Phi_{v1}$. $\Phi_{v2}$ may not necessarily be a good variable node update function by itself but it is derived to solely correct the failures of $\Phi_{v1}$. Because of this, it must be noted that the FER performance of the decoder using both variable node update functions sequentially can not be worse than the decoder using just $\Phi_{v1}$. This strategy is useful especially when considering dense graphs since even decoders using good variable node update functions that are obtained from the described methodology can fail for a low-weight error pattern due to many interconnections being present among the nodes in the graph. Due to using $\Phi_{v1}$ as the initial update rule in the decoder, the 7-level linear-threshold decoder is expected to have good FER performance on any general LDPC code. Note that it is also possible to consider using two processors in parallel with each one using $\Phi_{v1}$ and $\Phi_{v2}$ respectively in order to increase the overall convergence speed of the decoder but the parallel implementation will also take up twice the amount of space on the hardware. Depending on hardware constraints either implementation can be chosen and both are considered within the scope of this invention. Also, in general, any number of update functions can be used in multilevel decoders either sequentially or parallely or both; and all these strategies are considered within the scope of this invention.

For the 7-level linear-threshold decoder, the constraints on the possible values for the messages in set M, thresholds in set Z, and channel values in set Y which completely specify the variable node update function $\phi_{v1}$ are as follows:
$L_1 < C < 2L_1$
$L_2 = 2L_1 + C$
$L_3 = 2L_2 + C$
$T_1 = L_1$
$T_2 = L_2$
$T_3 = L_3$ Any positive value chosen for the messages in set M and thresholds that satisfy these constraints will correspond to the same unique update function. In other words, a unique look-up table can be derived based on these constraints and this table form can be used for implementation or in the search of good multilevel decoders. The look-up table form of the update function $\Phi_{v1}$ corresponding to these sets of constraints is shown in Table 1 of FIG. 6. There is a one-to-one correspondence between Table 1 and the set of constraints in the algebraic description that define $\Phi_{v1}$. This is illustrated with an example. From the first constraint, let us choose, say $C=1.5$, $L_1=1$. Based on the remaining constraints, we obtain $L_2=3.5$, $L_3=8.5$, $T_1=1$, $T_2=3.5$ and $T_3=8.5$ is obtained. In other words, the message set to be $M=\{-8.5, -3.5, -1, 0, 1, 3.5, 8.5\}$ and the threshold set to be $Z=\{1, 3.5, 8.5\}$ is chosen. Notice that this particular $\Phi_{v1}$ can be considered as a non-uniform quantization scheme. Now let us consider the case when the incoming messages are say $L_2, -L_1$ and the channel value is $-C$ as an example. Based on the definition of $\Phi_{v1}$, the sum of all the incoming messages including the channel value is determined and then the Q function is used to determine the outgoing message. In this example, the sum is $L_2 - L_1 - C = 3.5 - 1 - 1.5 = 1$ which lies between the thresholds $T_1$ and $T_2$. Using the Q function and the defined threshold set Z, the outgoing message as $L_1$ is obtained. Referring to Table 1, it is shown that the for incoming messages $L_2, -L_1$ and the channel value is $-C$, the outgoing message is $L_2$, and this matched with the value obtained from the algebraic description. All the remaining rules in Table 1 can be verified in a similar manner. Therefore, irrespective what values are chosen for the magnitudes and thresholds, as long as the chosen values satisfy the constraints, they will all correspond to the same look-up table shown in Table 1.

Similarly, the set of constraints that specify the variable node update function $\Phi_{v2}$ is provided. The constraints are:
$L_1 < C < 2L_1$
$L_2 = 2 L_1$
$L_3 = 2 L_2 + C$
$T_1 = L_1$
$T_2 = L_2$
$T_3 = L_3 - C$ The look-up table form of the function $\Phi_{v2}$ corresponding to these set of constraints is shown in Table 2 of FIG. 7.

A 5-level decoder according to the present invention is now described. In particular, the algebraic description for the 5-level decoder is now described.

The 5-level decoder provided in this invention uses just a single update function $\Phi_v$ but this function is a non-linear threshold function. Unlike linear-threshold decoders, in addition to defining the set of constraints on the magnitudes and thresholds, the channel weight function $\Omega$ used to compute the channel weight $w_c$ must also be specified. In general for a fixed number of levels and given that only a single update function is used for lower complexity, non-linear threshold decoders may have the potential to perform better than linear-threshold decoders. However, searching for good non-linear threshold decoders can be much more complicated when incorporated into the methodology, and it is also possible that a good linear-threshold decoder using higher number of levels in the set M than the non-linear threshold decoder, can perform just as good. Also, if the algebraic form of $\Phi_v$ is used for implementation, it is evident that there is added complexity due to an extra computation involving the channel weight function $\Omega$. However, if the look-up table form of $\Phi_v$ is used for implementation, then the nonlinear-threshold decoders have the same amount complexity as linear-threshold decoders.

Both the look-up table form and the algebraic form of the variable node update function $\Phi_v$ are required and have their own advantages with respect to decoder implementation depending on the application and hardware constraints. This shall be addressed in greater detail while describing the implementation aspects of multilevel decoders.

For the 5-level decoder, the message set is defined as $M=\{-L_2, -L_1, 0, L_1, L_2\}$ and the threshold set is defined by $Z=\{T_1, T_2,\}$. The constraints on the magnitudes and thresholds are
$C = L_1$
$L_2 = 2L_2 + C = 3 L_1$
$T_1 = L_3$
$T_2 = L_2$
If $m_1$ and $m_2$ are the incoming messages, the channel weight function used to compute $w_c$ is given by $$w_c = \Omega(m_1, m_2)$$
$$= 1$$
$$= ((\text{sign}(m_1) \oplus \text{sign}(m_2)) \cdot \sigma(|m_1| + |m_2| - 2L_2))$$

The function $\sigma$ can be considered as a simple comparator that outputs a one whenever the sum of the magnitudes of the incoming messages equals $2L_2$. The corresponding look-up table for this update function $\Phi_v$ is shown in table 3 of FIG. 8. We also provide the look-up table for the variable node update function of a 7-level nonlinear-threshold decoder that uses a single update function, which is shown in table 4 of FIG. 9, and considered part of the invention.

The decision rule performed at the variable node can be carried out using a look-up table that is again derived based on the algebraic form of $\Phi_v$ or by simply adding the messages and taking the sign of the result. The latter is used when the algebraic form of $\Phi_v$ is used for implementation and requires lower memory requirements. Whereas the former may be needed when the hardware implementation is carried out using the look-up table form of $\Phi_v$ and when there is a strict constraint that the messages must be represented by fixed number of bits during the entire processing of the messages in the decoder operations.

The next part of the detailed description describes the implementation of multilevel decoders.

The implementation aspects of the invention and apparatus for the 3-bit decoders presented as part of this invention is now addressed. In order to facilitate the hardware implementation of the decoding process, the messages and channel values are represented as binary vectors using a fixed number of bits. The binary vectors do not represent the actual values of $L_i$, but they do represent the belief and its reliability. For example, for the message quantization of the 3-bit decoders in this invention, each level $L_i$ in the set M is represented by a 3-bit binary vector. The most significant bit (MSB) denotes the belief of whether the associated node is one or zero, i.e., the sign of $L_i$. All positive levels have an MSB of zero and all negative levels have an MSB of 1 (again assuming the typically binary map described previously). The next two bits denote how the strong the belief is. For example, $L_3$ is the strongest possible level with a belief of zero and hence its 3-bit representation is 011. In this manner, the mapping from the levels $L_i$ in set M to their 3-bit binary representation can be derived and is shown in Table 5 of FIG. 10. Note that the zero level can take two possible representations as it does not assume any sign and it can be conveniently fixed to one of them.

Figures 10, 11:
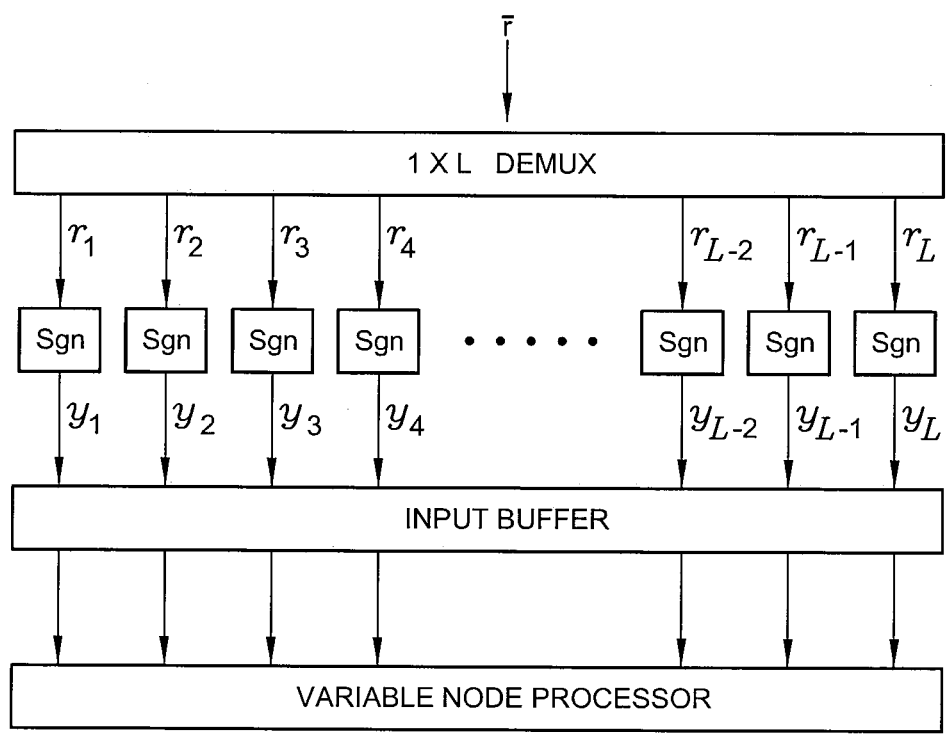
FIG. 10 is a table showing a 3-bit binary vector representation of levels according to the present invention.
FIG. 11 is a channel quantizer according to the present invention.

Referring now to FIG. 11 regarding channel quantizations, since the channel values are quantized to the set $Y=\{-C,C\}$, one bit is sufficient to represent the channel values $y_i$. For other channels such as AWGN, these decoders are still applicable but it may be advantageous to allow more than two levels in the set Y. Channel quantization in such a case becomes more complex with the need to define another threshold set that determines the channel values $y_i$. In the case of $Y=\{-C, +C\}$, the channel value $y_i$, is simply obtained by taking the sign of the observation value $r_i$ to obtain the channel value $y_i$. Each channel value $y_i$ is then stored in an input buffer and fed as input to a variable node $v_i$ in the variable node processor for use during decoding in every iteration. Here L denotes the code length of the code or length of the graph.

Figure 12:
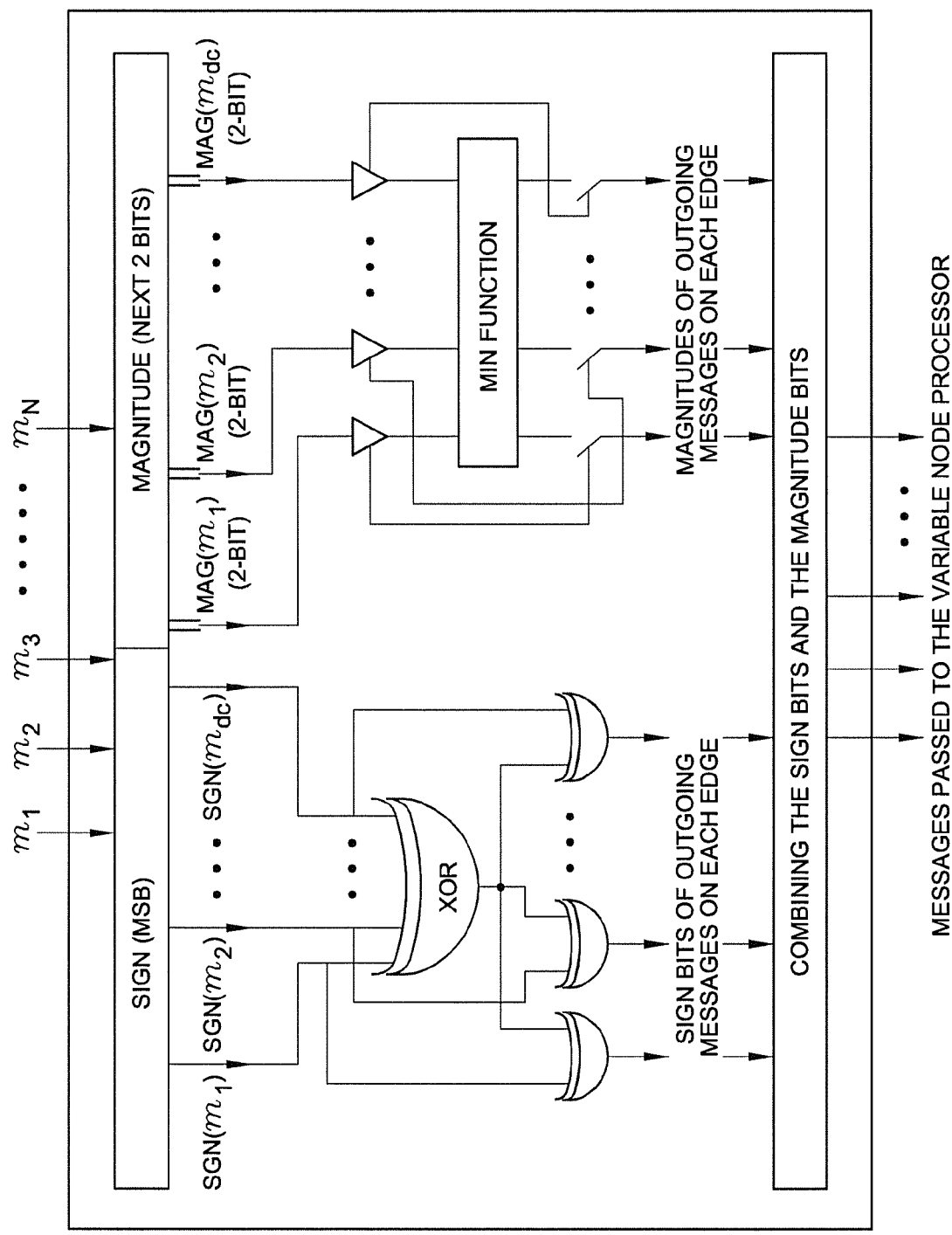
FIG. 12 is a schematic diagram of a circuit for processing at a check node according to the present invention.

In the first iteration since all messages are cleared to zero, the variable nodes simply send the channel values $y_i$ to the check nodes for processing. At the check node, the function defined by $\Phi_c$ is implemented. There are two components in implementing $\Phi_c$ the sign component and the magnitude component. The sign component simply finds the modulo 2 sum of the sign bits. The magnitude component determines the minimum value of the magnitudes of the incoming messages. Sign bit of an incoming message denoted as sgn would just be its MSB. Magnitude of an incoming message denoted as mag would be a 2-bit vector corresponding to the next two bits (magnitude bits). FIG. 12 illustrates the implementation of the check node processing at a check node where $m_1$, $m_2, \_, m_{dc}$ denote all the incoming messages to the check node of degree $d_c$. For the min operation, the outgoing messages are sequentially determined. The tri-state buffers in the min operation are deactivated when its corresponding switches at the output are closed, ensuring that the incoming message of a particular edge is not included in the calculation of the outgoing message on that edge. The switches are controlled by the internal clock signal. The circuit can easily be modified to also compute the outgoing messages parallely for faster speeds.

The messages from the check node processor are passed to the variable node processor via an edge memory that stores information about connections between the variable nodes and check nodes, and directs the messages to their respective variable nodes. At the variable node processor, the specific function $\Phi_v$ is implemented based on the message set M, threshold set Z, channel output set Y and channel weight function $\Omega$ if it is nonlinear-threshold function. Implementation of the function $\Phi_v$ can be carried out arithmetically using the algebraic form of $\Phi_v$ with the help of extra bits used during variable node processing or it can be implemented using the look-up table form of $\Phi_v$ where no extra bits are used during variable node processing. The arithmetic implementation using the algebraic form of $\Phi_v$ can be carried out by using a map that converts the 3-bit binary vectors to 2's complement forms that represent the actual values of $L_i$. Details for both the arithmetic implementation and the look-up table implementation are provided. It must be noted that although the implementation aspects from the context of 3-bit decoders for column-weight three LDPC codes is discussed, this is purely for the purpose of simple explanation as they are considered part of this invention, and the schematics provided here are easily extendible for any n-bit decoder and any column-weight LDPC code including irregular LDPC codes. From the context of column-weight three codes, let $m_1$, $m_2$, and $m_3$ be the incoming messages from the check node processor for variable node $v_i$. Also during variable node processing at node $v_i$, the channel value $y_i$, is input to the variable node $v_i$ from the input buffer.

In order to describe the arithmetic implementation, the example described previously in the algebraic form of the variable node update function $\Phi_{v1}$ is referred to for enabling easy understanding of the scheme. In that example, the values $C=1.5$ and $L_1=1$ were chosen. Based on the remaining constraints, the chosen message set was $M=\{-8.5, -3.5, -1, 0, 1, 3.5, 8.5\}$ and threshold set was $Z=\{1, 3.5, 8.5\}$. It is evident from the algebraic form of $\Phi_{v1}$ that the arithmetic implementation involves adding the incoming messages and the channel value, and applying the quantization function Q to the resulting sum. In order to facilitate this, the messages which are represented as 3-bit binary vectors must be converted to binary vectors in 2's complement form which represent the actual values of $L_i$. Since the 2's complement form is used, extra bits to represent the sign, integer and fractional parts of the values of $L_i$ are needed. In the case of our example, since the largest value of the levels is 8.5, 1 bit for the fractional part and 5 bits for the integer part (4 bits to represent the value of 8 and 1 bit represent the sign) are needed. Thus, a total of six bits to represent the values of $L_i$ chosen in this example in 2's complement form are needed. For example, the value of $L_3=8.5$ is represented as 01000.1 or simply 010001 (last bit represents the fractional part) in the 2's complement form. Similarly the value $-L_3=8.5$ is represented as 101111. Table 6 of FIG. 13 shows the conversion from the 3-bit vector representation to the 6-bit 2's complement representation, and this table can be considered as a map used for conversion. The map for conversion can be implemented by using a simple look-up table as ROM or by using simple combinatorial logic that implements Boolean functions defining the map. The channel value y which is represented as a single bit must also be converted to six bit vector in 2's complement form. In this case, $y_i=0.5$ is represented as 000001 and $y_i=-0.5$ is represented as 111111. This conversion can be implemented using a one-to-six bit code converter which also contains simple combinatorial logic. Note that the map used for conversion is defined based on the values chosen for $L_i$ and for a different set of values, a different map may be defined.

Figure 14A:
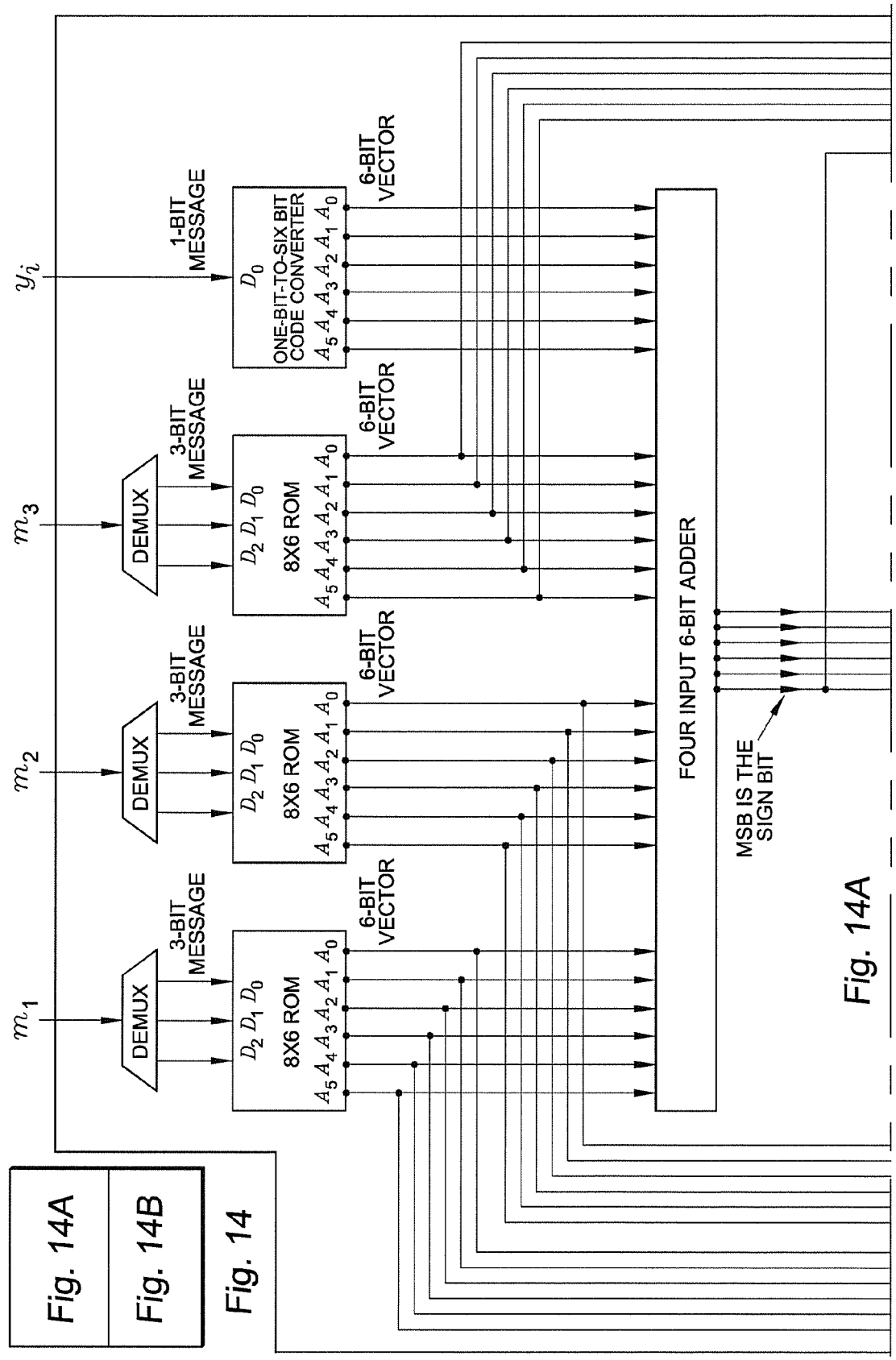
FIG. 14 is a schematic diagram of a variable node processor using an arithmetic implementation according to the present invention.
Figure 14B:
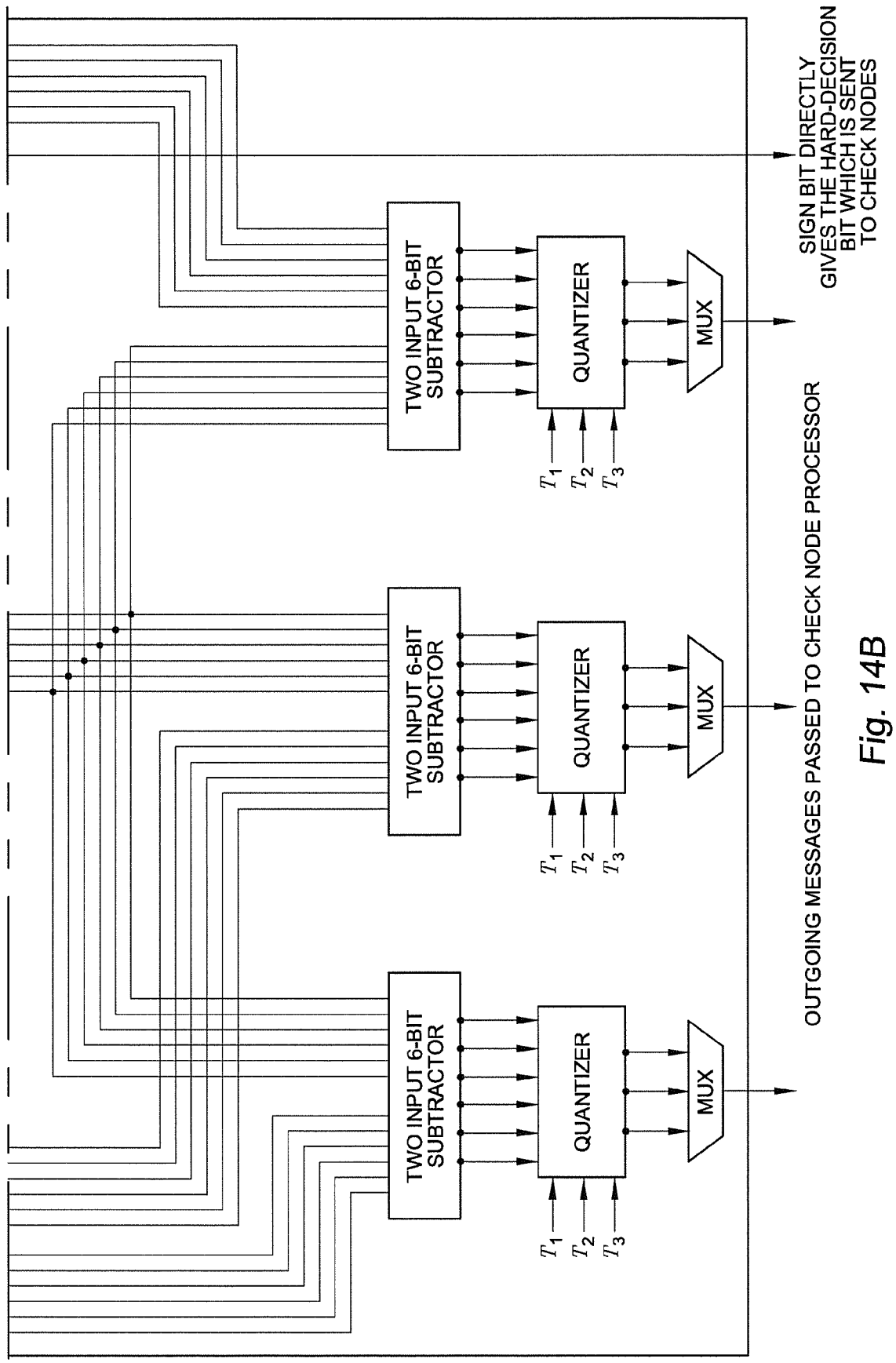

FIG. 14 shows the general schematic for arithmetic implementation using the algebraic form of $\Phi_{v1}$. This simple scheme can be used to arithmetically implement any variable node update function $\Phi_v$ using the algebraic form. For implementing nonlinear-threshold decoders, an extra component is required to accommodate for the channel weight computation. In FIG. 14, the sum of all the incoming messages and channel value is computed. Note that the hard-decision rule can be conveniently incorporated into the variable node processing by simply observing the sign bit of this total sum. The outgoing messages (which are extrinsic messages) are then computed by simply subtracting the incoming message from this total sum on the edge for which the outgoing message is being determined, and then passing the results to the quantizer that implements the quantization function Q. The quantizer utilizes the threshold set Z to determine its output and can be implemented in many ways such as use of sequential comparators or even using techniques that transform the quantizer to simple shift operations in the messages. Standard implementation schemes for the quantizer that are also simple are well known in the area of digital IC design. Note that the ROM components and the one-to-six-bit-code converter shown in FIG. 14 can be replaced by reconfigurable components such as EPROM and EEPROM. Hence, the map for conversion is reconfigurable to implement different message sets M that are chosen based on the constraints defined for the function $\phi_v$. Similar can be said about the quantizer which uses a specific threshold set Z. In this manner, reconfigurability can be easily incorporated due to low memory requirements in the implementation. Note that in the scheme shown, the messages are parallely computed at once but a sequential implementation is also possible in order to reduce the number of components used.

Figure 15:
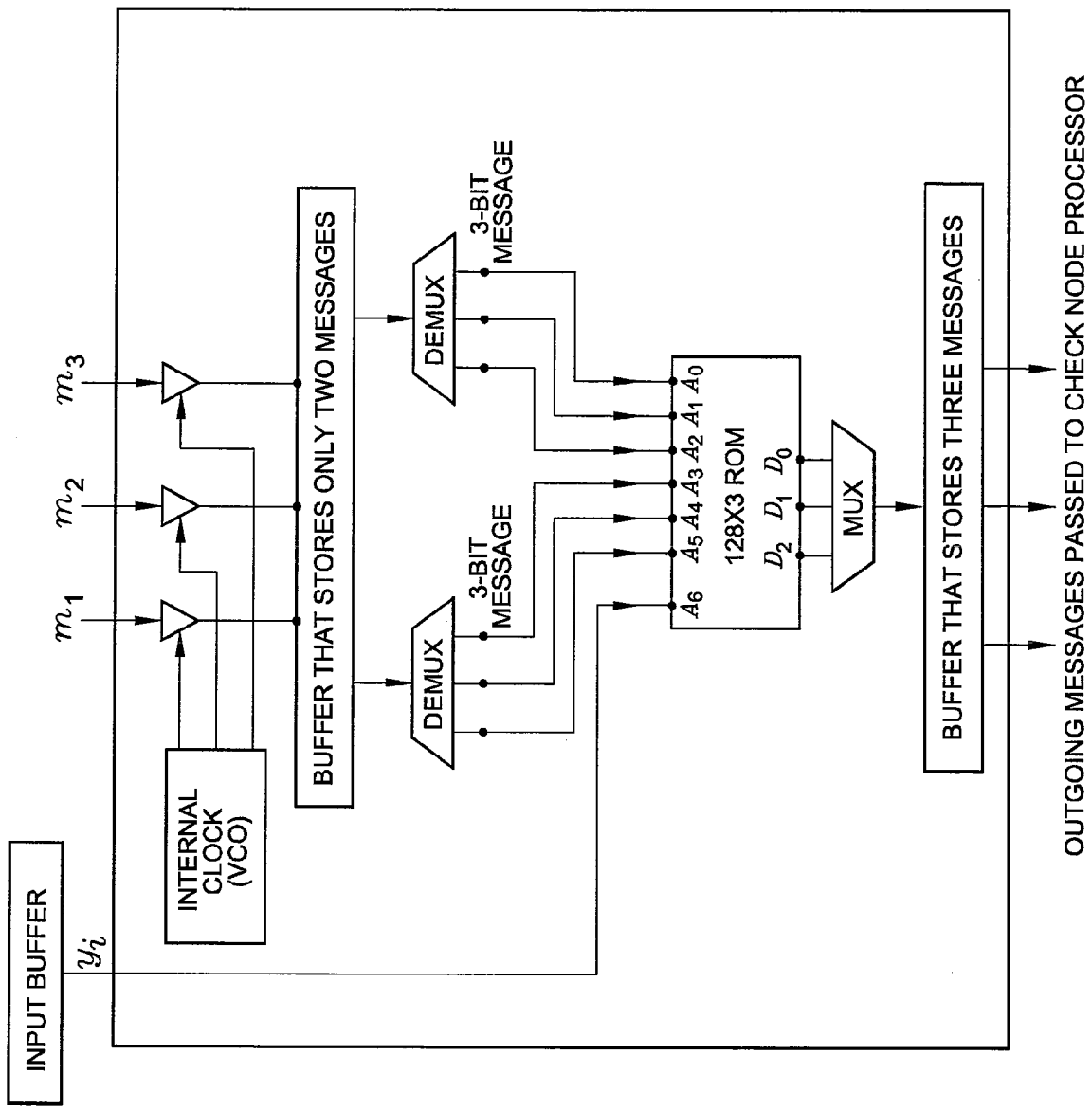
FIG. 15 is a schematic diagram of a variable node processor using a look-up table implementation according to the present invention.
Figure 16:
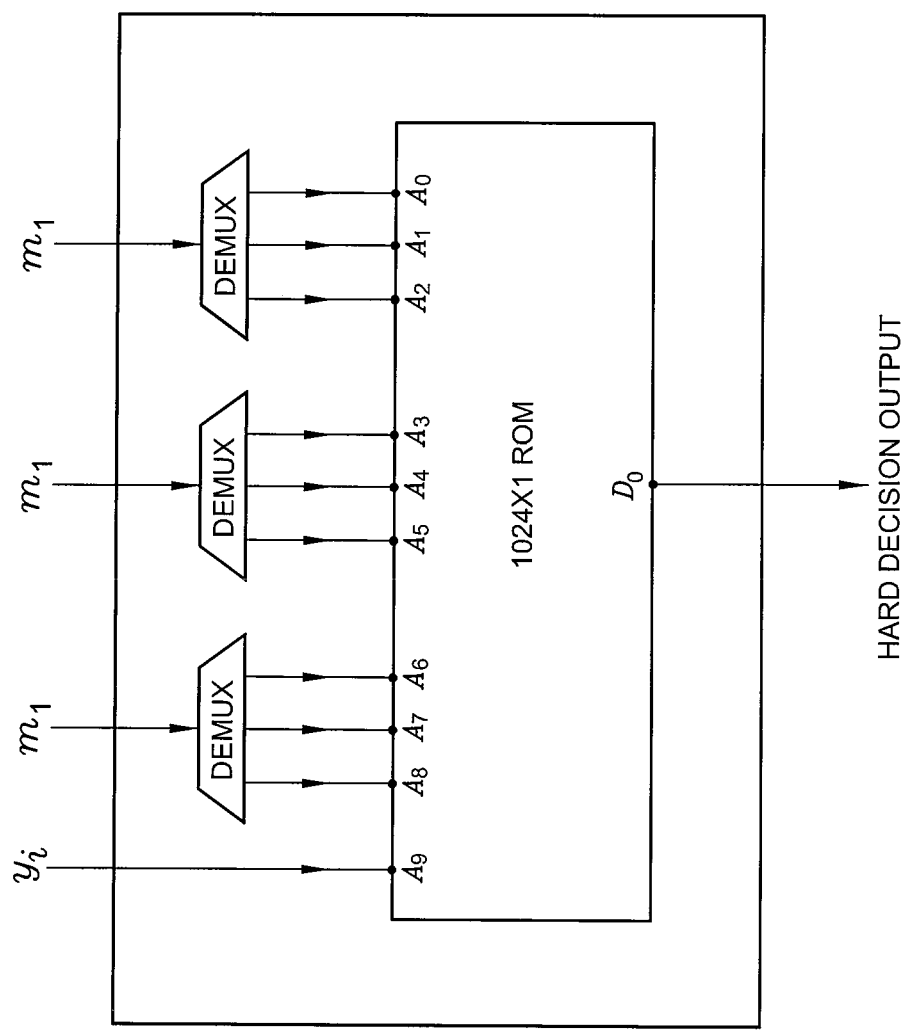
FIG. 16 is a schematic diagram of a circuit for implementing a hard decision at a variable node according to the present invention.

FIG. 15 shows the circuit for the processing at the variable node $v_i$ using the look-up table form. The look-up table corresponding to $\Phi_v$ stored in a ROM is used to determine the outgoing message. Due to larger memory requirements in this implementation, outgoing messages are computed sequentially in this scheme instead of parallel so that only a single ROM is required for each variable node. But again the messages can be computed parallely using multiple ROMs of the look-up table if hardware area is not a constraint. The tri-state buffers (represented as triangles) in FIG. 15 ensure that only extrinsic messages are calculated by allowing only the incoming messages that are not on the particular edge for which the outgoing message is being calculated, to enter the buffer. This is done by using an internal clock that controls the activation of the tri-state buffers and only two incoming messages are allowed to enter the buffer during any particular time-step. Reconfigurability can again be incorporated by using EPROM and EEPROM instead of ROM. In the look-up table implementation, the decision rule at a variable node has to be separately implemented using another look-up table which takes all the incoming messages and channel value as inputs. FIG. 16 illustrates implementation of the decision rule. The hard decision outputs are sent to the check nodes to check if the decoder has converged to a code word.

Based on the implementation schemes described for variable node processing as well as decision rule, several advantages that make the arithmetic implementation using the algebraic form an attractive choice for implementing $\Phi_v$ over look-up table form are evident. Firstly, the arithmetic implementation scheme is simple and straightforward and if the modules of the implementation use reconfigurable components, then changing the update function $\Phi_v$ can be easily done by simply changing the thresholds and magnitudes. This is advantageous especially for the case of a decoder using multiple update functions such as the 7-level linear-threshold decoder in the invention and also for enabling flexibility and reconfigurability to modify decoders in the hardware whenever the need arises. Secondly, for multilevel decoders that use larger number of bits (like say 4 or 5 bits), the look-up table implementation of $\Phi_v$ can become quite large leading to large memory requirements and utilization of hardware area, whereas the complexity will only linearly increase with number of bits due to the adder and quantizer for the arithmetic implementation. Thirdly, the decision rule is directly incorporated in the algebraic form of $\Phi_v$ and can be made part of the variable node processing unit as opposed to separately using a look-up table for the decision rule (which requires extra memory).

However, if only n bits for the n-bit decoders to represent the messages are used, the look-up table form of $\Phi_v$ needs to be used. The look-up table form may especially be well suited for implementing nonlinear-threshold functions when the message set is small and when there is no strict constraint on the hardware area utilization since there is no added complexity involving the channel weight function $\Omega$ in the look-up table form. Also the look-up table form may be helpful during search of good multilevel decoders in the methodology. Either of the two implementations can be used based on the hardware constraints, decoder speed requirements, and type of application that it is used for.

Figure 17:
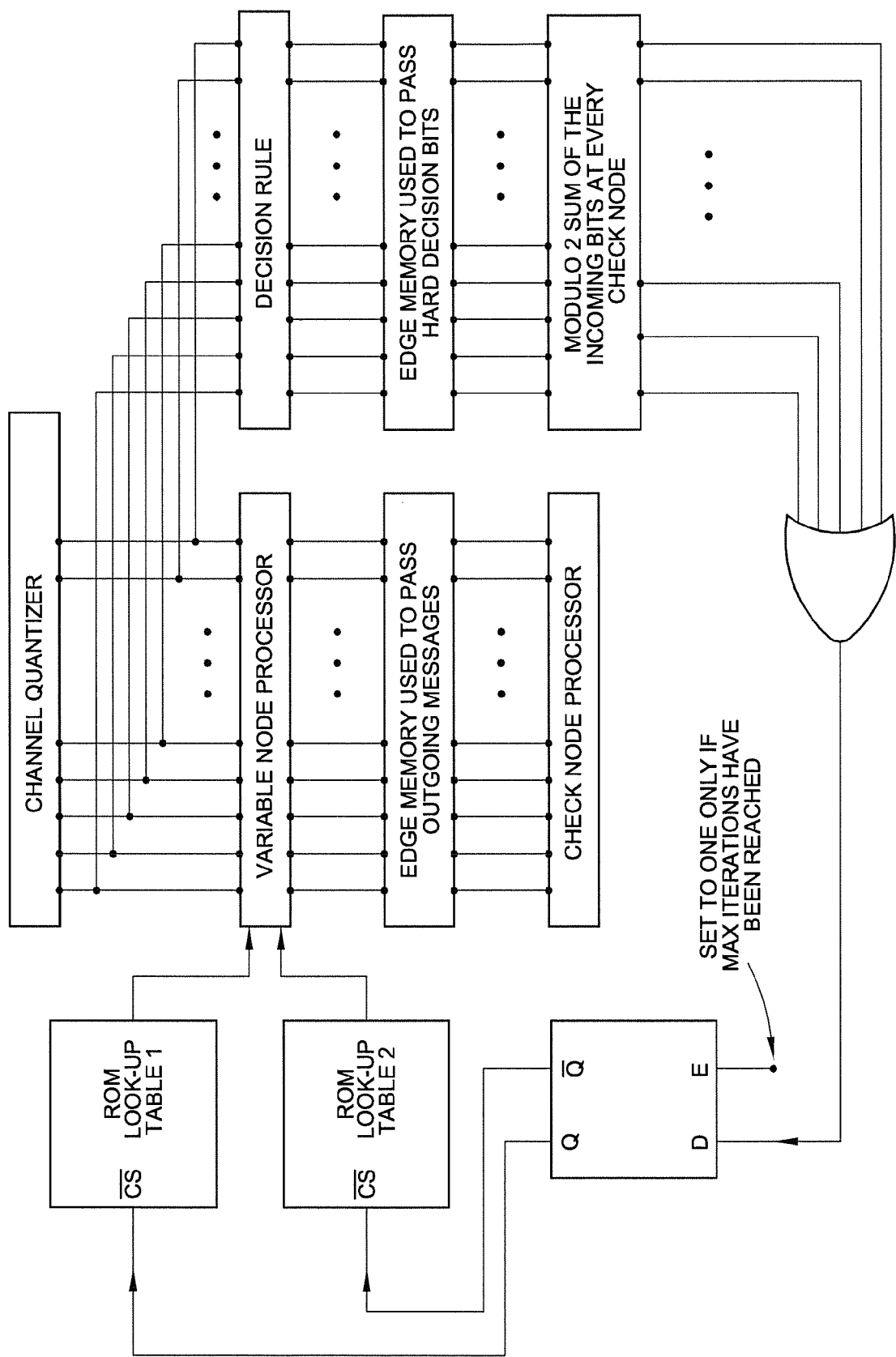
FIG. 17 is a schematic diagram of a circuit for implementing an overall decoding process with sequential use of multiple variable node update functions according to the present invention.

At the check nodes, each check node determines the modulo 2 sum of the incoming bits in a similar fashion shown in the sign component of FIG. 17 and checks if the sum is zero or not. If the sum is zero, the check node is considered to be satisfied. If at least one check node is unsatisfied, the decoder reports a failure. This can be implemented by feeding the modulo 2 sum of the bits at each check node to a logical OR gate and determining the output. This output can be utilized to set the variable node processor to use different update functions. Although this can be incorporated for both arithmetic and look-up table implementation to 7-level linear-threshold decoder, this scheme for look-up implementation is illustrated. In this scheme, look-up table of $\Phi_{v1}$ or $\Phi_{v2}$ (which are both ROMs) is selected based on the output from the logical OR gate by feeding this output to the chip selection pin of the ROM chips. The chip selection ($\overline{CS}$) pin of the ROM allows it to be enabled or disabled based on its input. FIG. 17 provides a general schematic of the entire decoding process including different modules and the provision for using two update functions. The schematic in FIG. 17 can be considered as a sequential implementation for using two update functions but can be easily extended to accommodate multiple update functions which is also considered within the scope of this invention. Note that in the scheme shown in FIG. 17, it is assumed that all variable nodes (or check nodes) are updated parallely at the same time which is a parallel scheduling. A sequential scheduling can also be used in order to reduce the area of hardware space utilized.

Figure 18:
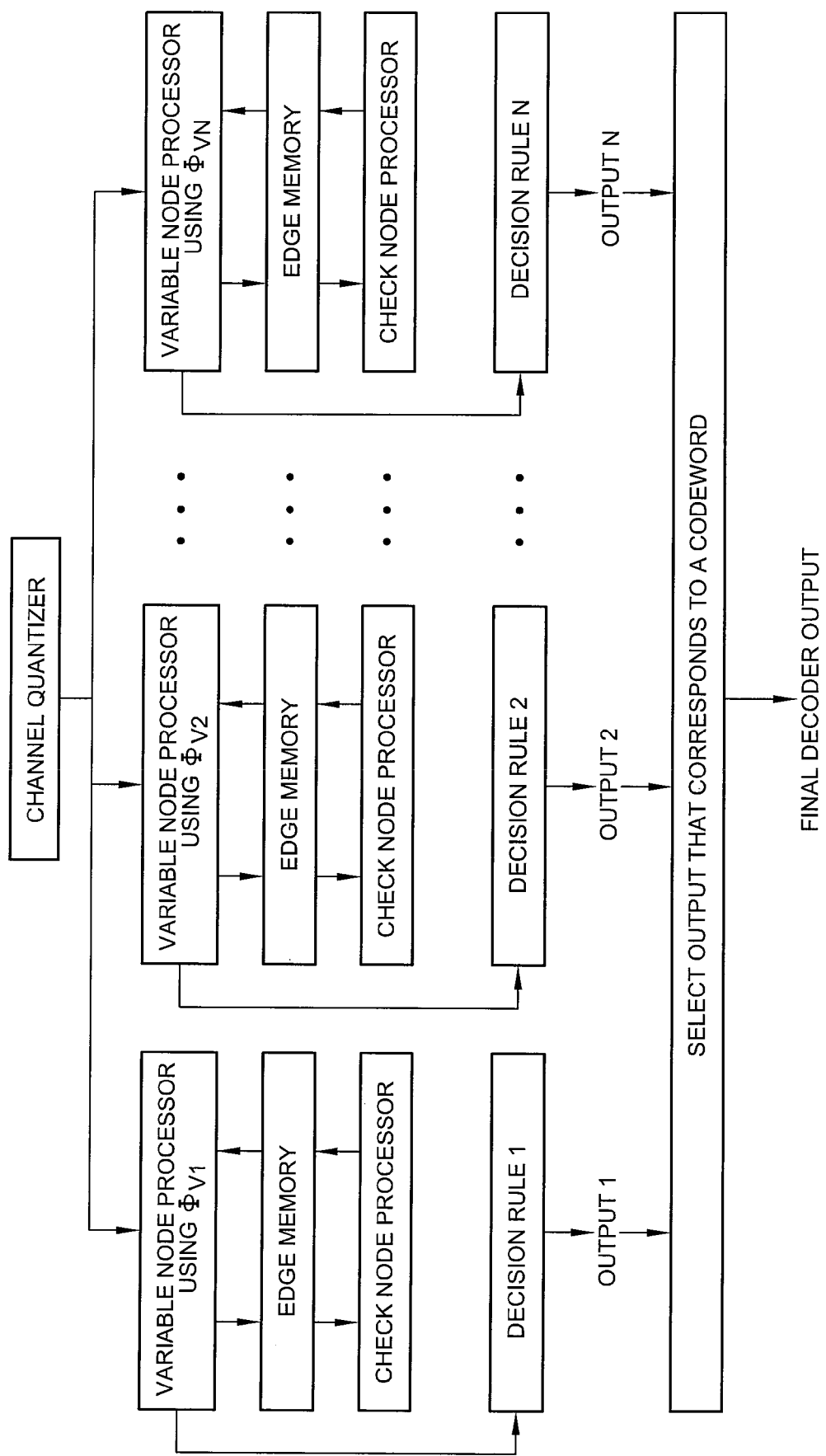
FIG. 18 is a general schematic diagram using parallel implementation of multiple variable node update function according to the present invention.

FIG. 18 provides a general schematic for parallel implementation of multiple updates functions used by the variable nodes. The implementation uses N updates functions in parallel. In this case, separate processors are used parallely during decoding, and the output that corresponds to a codeword is chosen as the final output of the decoder.

A combination of both serial and parallel implementations for the use of multiple update functions can also be used, by utilizing schemes presented in FIGS. 17 and 18 in a combined manner. This is also considered within the scope of the present invention.

It is contemplated that he modules in the present invention can be implemented in various technologies, such as technologies based those where messages in present invention are represented as electric, magnetic and/or electromagnetic signals which are used in semiconductor technology, magnetic technology and optical technology, as well as in those where messages are represented as chemical signals, mechanical signals, such as acoustic signals or signals of complex nature representing change in a physical quantity. Machine readable medium including instructions used to control a machine to implement one or more method steps in accordance with the invention are contemplated and to be considered within the scope of some embodiments of the invention.

Figure 19:
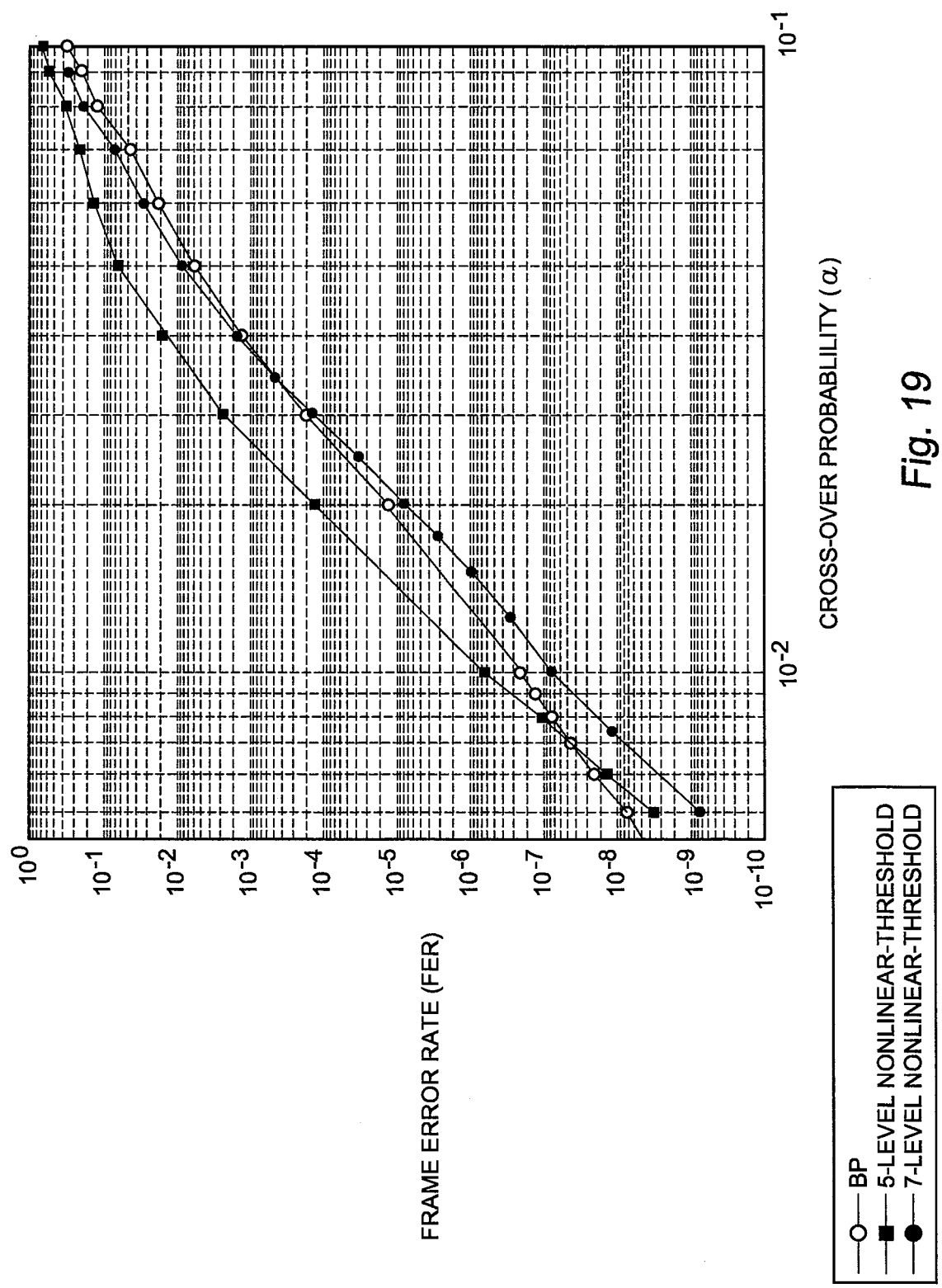
FIG. 19 is a graph of performance comparisons on the Tanner code with respect to implementations of the present invention
Figure 20:
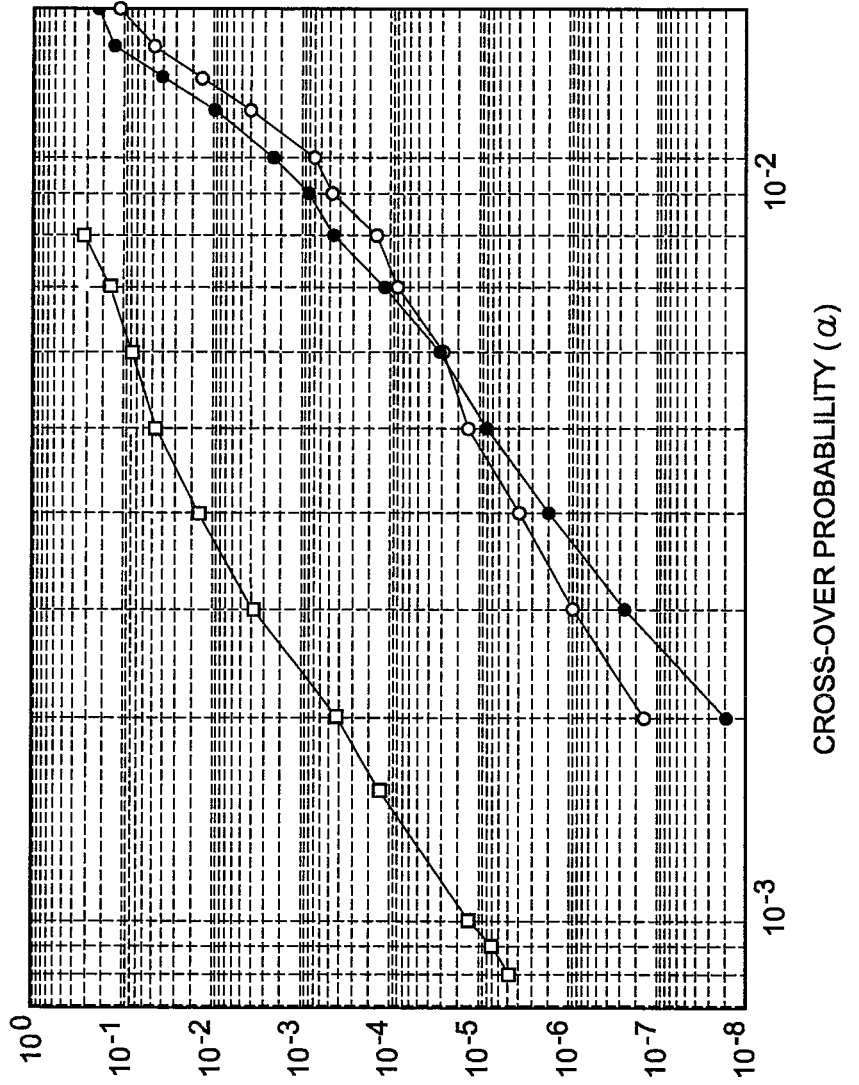
FIG. 20 is a graph of performance comparisons on the quasicyclic code with respect to an implementation of the present invention.
Figure 21:
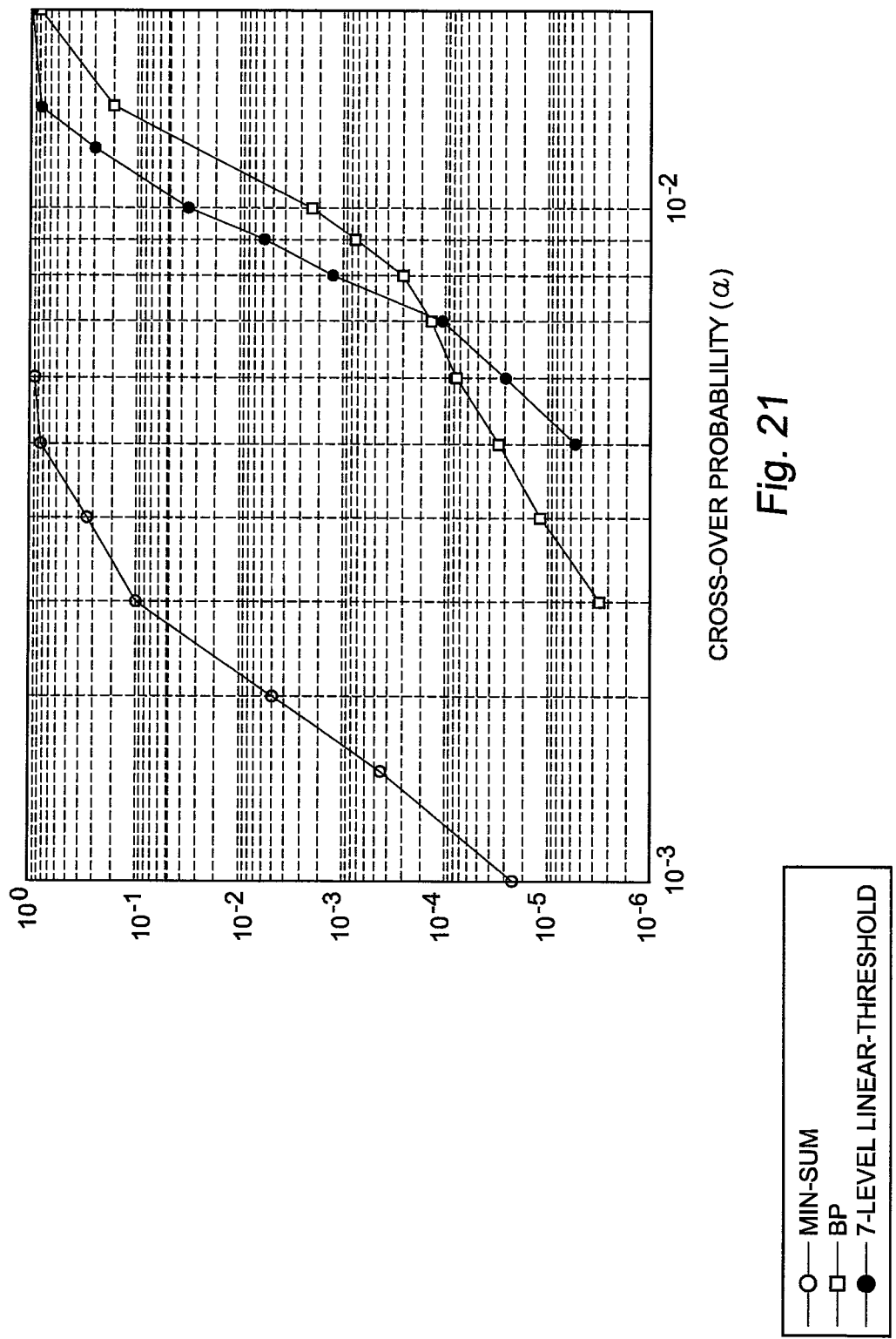
FIG. 21 is a graph of performance comparisons on the MacKay code with respect to an implementation of the present invention.

It is evident from the details of the implementation that the decoders in this invention are much lower in complexity compared to the standard message-passing algorithms such as BP algorithm as well as existing state of art decoders but at the same time they guarantee good FER performance in the high SNR region for a finite-length code. Simulation results provided for the 7-level decoders and the 5-level decoder demonstrate the ability and tremendous potential of multilevel decoders specifically described as part of this invention, to significantly outperform the floating-point BP algorithm. For the simulations, decoders were applied to three LDPC codes that were chosen to cover a broad range of codes. The first is the Tanner code (codelength=153, number of checks=93) which is well-known in the research community. The second code is a quasicyclic code of length 768 since quasicyclic codes are important for ease of implementation and have high practical significance. The third code was a MacKay code of length 4095 which was randomly constructed. The performance plots for the three codes are shown in FIGS. 19, 20 and 21. Both the 7-level decoders and 5-level decoder show significant improvement in the slope of the error-floor compared to floating-point BP. On all three codes, the 3-bit decoders surpass the floating-point BP decoder in the error floor region. Note that the floating-point implementation of BP decoder can also have issues related to numerical instabilities that cause error floors to occur much earlier at higher SNR. Such issues are not present for the class of multilevel decoders presented in this invention.

It will be apparent to those skilled in the art that various modifications and variation can be made in the present invention without departing from the spirit or scope of the invention. As would be apparent to those skilled in the art equivalent embodiments of the present invention can be realized in firmware, software, or hardware, or any possible combination thereof. In addition, although representative block diagrams are shown for an aid in understanding the invention, the exact boundaries of the blocks may be changed and combined or separated out as desired for a particular application or implementation. Thus, it is intended that the present invention cover the modifications and variations of this invention provided they come within the scope of the appended claims and their equivalents.

We claim:

1. A message passing decoder for low-density parity check (LDPC) codes, in which messages passed between check nodes and variable nodes are from a finite multilevel message set (MMS), and in which a message update function at a variable node calculates a message update value from the MMS by applying a quantization function to a value computed by a preliminary function, wherein the preliminary function has inputs from the MMS and a channel output set.

2. The message passing decoder of claim 1, wherein the LDPC codes have a fixed column-weight.

3. The message passing decoder of claim 1 wherein the preliminary function is a linear function.

4. The message passing decoder of claim 1 wherein the preliminary function is a non-linear function.

5. The message passing decoder of claim 1 wherein 3-bits are used for representation of the messages in the MMS.

6. The message passing decoder of claim 1 further comprising a channel output set that is quantized.

7. The message passing decoder of claim 1 wherein the message update function is implemented by a look-up table.

8. A message passing decoder for low-density parity check (LDPC) codes, in which messages passed between check nodes and variable nodes are from a finite multilevel message set (MMS), and in which a plurality of message update functions at the variable nodes calculate message update values from the MMS by applying quantization functions to values computed by preliminary functions, wherein the preliminary functions have inputs from the MMS and a channel output set.

9. The message passing decoder of claim 8, wherein the LDPC codes have a fixed column-weight.

10. The message passing decoder of claim 8 wherein the preliminary functions comprise a plurality of linear functions.

11. The message passing decoder of claim 8 wherein the preliminary functions comprise a plurality of non-linear functions.

12. The message passing decoder of claim 8 wherein the preliminary functions comprise a plurality of either linear or non-linear functions.

13. The message passing decoder of claim 8 wherein 3-bits are used for representation of the messages in the MMS.

14. The message passing decoder of claim 8 in which the plurality of message update functions is the same for all variable nodes, and the message update functions may change from one iteration to another.

15. The message passing decoder of claim 8 in which the plurality of message update functions is the same for all iterations, and the message update functions may be different for different variable nodes.

16. The message passing decoder of claim 8 in which the plurality of the message update functions are combined.

17. The message passing decoder of claim 8 further comprising a channel output set that is guantized.

18. The message passing decoder of claim 8 wherein the message update functions are implemented by look-up tables.

19. A message passing decoding method comprising:
using a finite multilevel message set (MMS) for the messages passed between variable nodes and check nodes;
using a specifically defined message update at a variable node which calculates a message update value from the MMS by applying a quantization function to a value computed by a preliminary function, wherein the preliminary function has inputs from the MMS and a channel output set, and wherein the specifically defined message update function is is determined by generating a database of all possible subgraphs that are potentially trapping sets, performing decoding on the isolated subgraphs using different update tables under different error patterns and choosing for the message update function the table which has the best error correcting capabilities; and
using a min operation with a modulo 2 sum of signs operation to update messages at the check node.

20. The method of claim 19, where the specifically defined message update function is chosen to decode isolated subgraphs that could potentially lead to decoding failures.

21. The method of claim 19 further comprising:
using a plurality of specifically defined message update functions to update messages at the variable nodes.

22. The method of claim 21, where the plurality of specifically defined message update functions are chosen to decode isolated subgraphs that could potentially lead to decoding failures.

* * * * *

UNITED STATES PATENT AND TRADEMARK OFFICE
CERTIFICATE OF CORRECTION

PATENT NO. : 8,458,556 B2
APPLICATION NO. : 12/900584
DATED : June 4, 2013
INVENTOR(S) : Shiva K. Planjery et al.

It is certified that error appears in the above-identified patent and that said Letters Patent is hereby corrected as shown below:

In the Claims:

Claim 19, Column 22, line 53, delete second occurrence of "is"

Signed and Sealed this
Twenty-fourth Day of September, 2013

Teresa Stanek Rea
*Deputy Director of the United States Patent and Trademark Office*